United States Patent [19]

Hirota et al.

[11] Patent Number: 4,635,116
[45] Date of Patent: Jan. 6, 1987

[54] VIDEO SIGNAL DELAY CIRCUIT

[75] Inventors: Akira Hirota, Chigasaki; Takuya Tsushima, Ayase, both of Japan

[73] Assignee: Victor Company of Japan, Ltd., Yokohama, Japan

[21] Appl. No.: 705,733

[22] Filed: Feb. 26, 1985

[30] Foreign Application Priority Data

Feb. 29, 1984 [JP] Japan .................................. 59-38134
Mar. 6, 1984 [JP] Japan .................................. 59-43643
Mar. 6, 1984 [JP] Japan ............................. 59-32627[U]

[51] Int. Cl.$^4$ ........................ H04N 5/14; G11C 27/02
[52] U.S. Cl. .................................... 358/160; 358/213; 365/45
[58] Field of Search ............... 358/160, 213, 148, 903, 358/21 R; 365/45

[56] References Cited

U.S. PATENT DOCUMENTS 4,297,728 10/1981 Lowe .................... 358/148
4,314,275 2/1982 Chapman ............. 358/213
4,536,795 8/1985 Hirota et al. ......... 358/160

Primary Examiner—James J. Groody
Assistant Examiner—Michael D. Parker
Attorney, Agent, or Firm—Michael N. Meller

[57] ABSTRACT

A video signal delay circuit comprises an input horizontal transfer register supplied serially with an input composite video signal, an input vertical transfer gate, a plurality of columns of vertical transfer registers, an output vertical transfer gate, an output horizontal transfer register, a horizontal transfer clock pulse generating circuit, a vertical transfer clock pulse generating circuit and a vertical transfer gate pulse generating circuit. The vertical transfer clock pulse generating circuit generates a vertical transfer clock pulse at a rate of once per one horizontal scanning period of the input composite video signal and additionally generates one or more vertical transfer clock pulses during a specific time period. Or, the horizontal transfer clock pulse generating circuit generates a horizontal transfer clock pulse having a selected phase or a selected number of horizontal transfer clock pulses.

16 Claims, 22 Drawing Figures

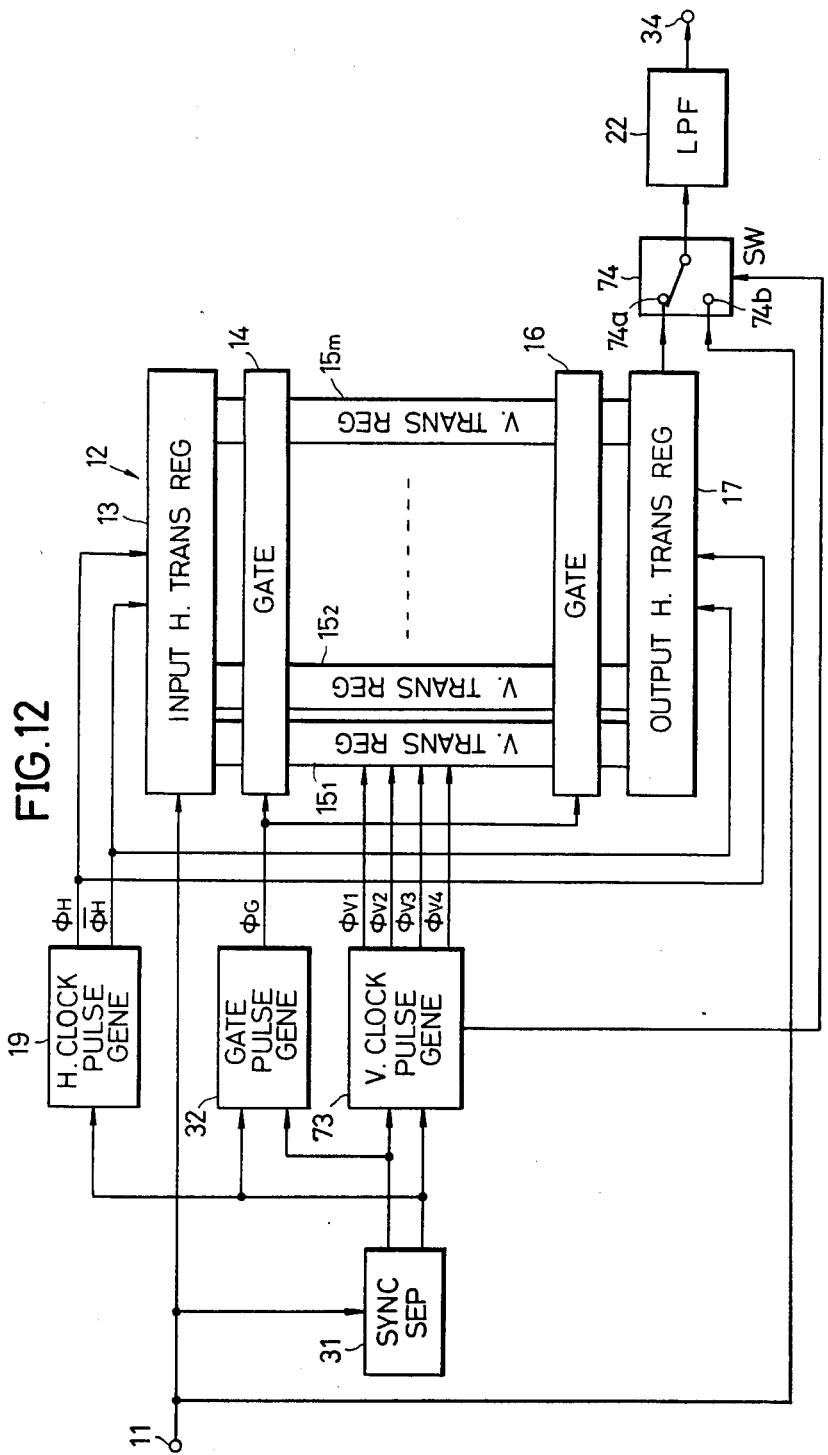

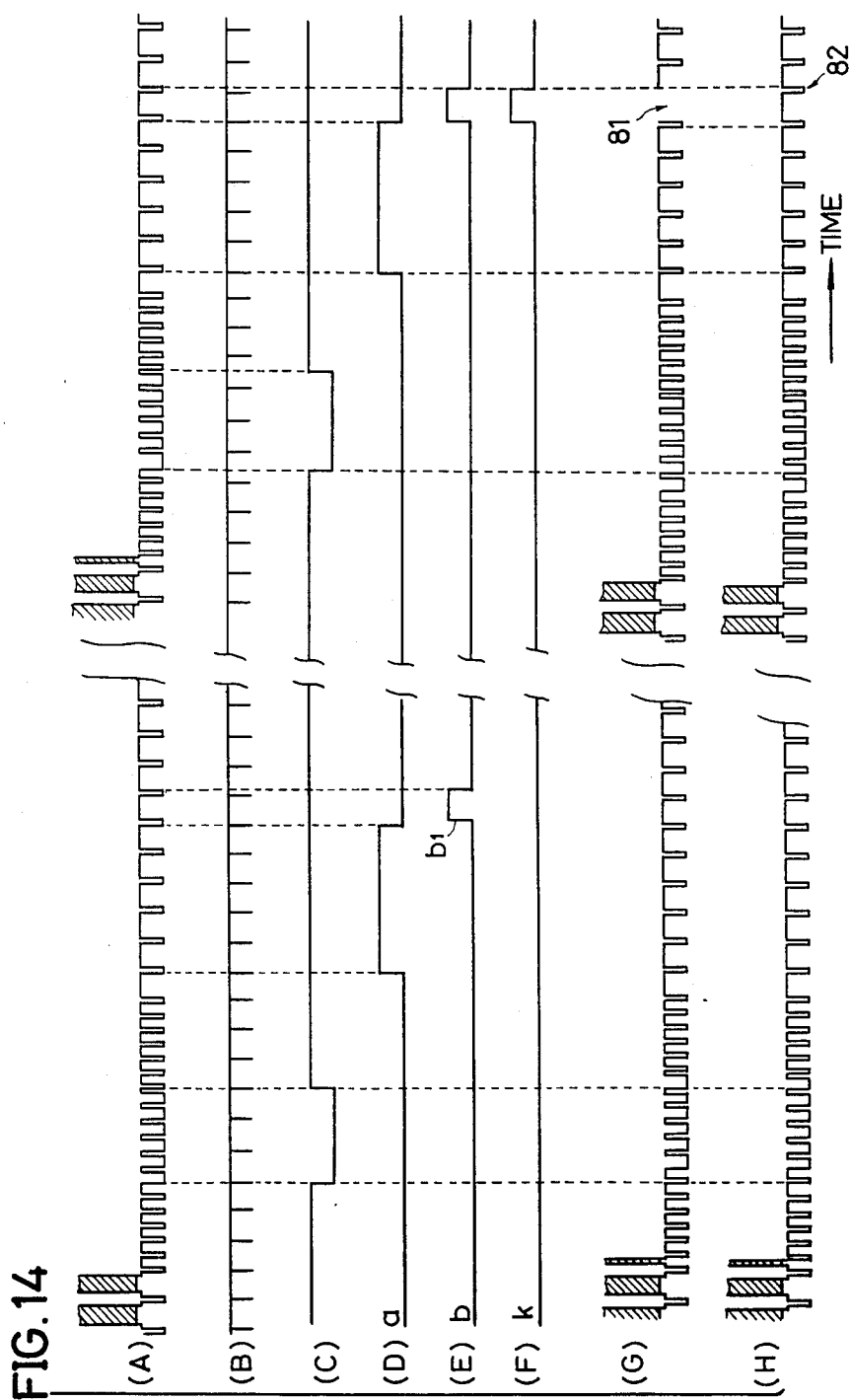

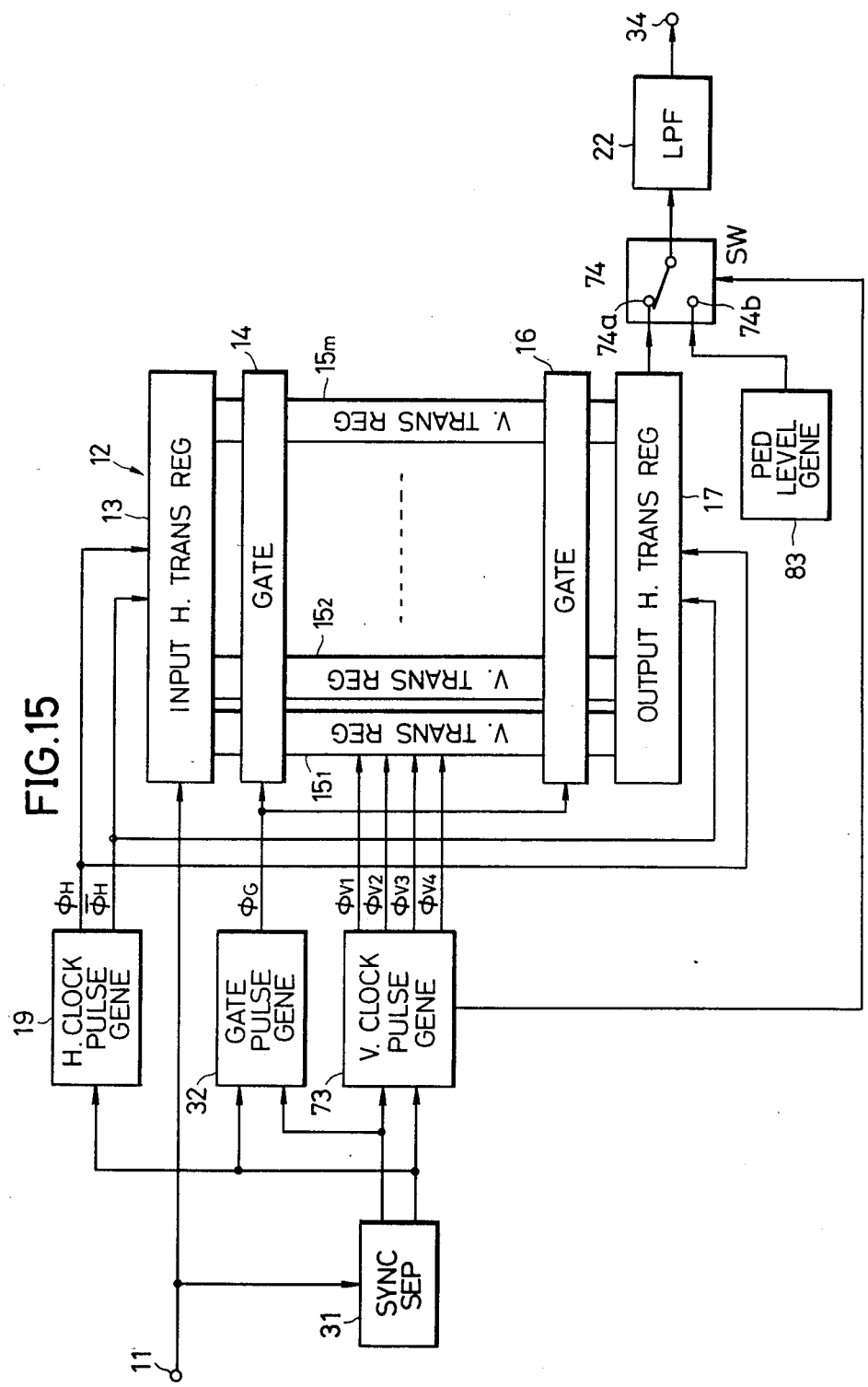

VIDEO SIGNAL DELAY CIRCUIT

BACKGROUND OF THE INVENTION

The present invention generally relates to video signal delay circuits, and more particularly to a video signal delay circuit at least comprising a semiconductor delay circuit part in which an input horizontal transfer register, a plurality of columns of vertical transfer registers and an output horizontal transfer register are arranged in a matrix arrangement, which video signal delay circuit delays an input composite video signal by a desired delay time.

Conventionally, in a video signal reproducing apparatus such as a video tape recorder (VTR), a delay circuit for providing a delay of one horizontal scanning period (1H) or one field is provided within a noise reduction circuit which reduces noise included within a reproduced composite video signal by use of the so-called line correlation. A delay circuit is also often used for performing a dropout compensation. In other words, a delay circuit is conventionally used for various purposes.

In a conventional video signal delay circuit, an input composite video signal applied to an input terminal is delayed by a predetermined delay time in a semiconductor delay circuit part and is then produced through an output terminal after being passed through a lowpass filter wherein a frequency component of a horizontal transfer pulse is eliminated. The semiconductor delay circuit part comprises an input horizontal transfer register, an input vertical transfer gate, vertical transfer registers, an output vertical transfer gate, and an output horizontal transfer register. For example, as previously proposed in a U.S. patent application Ser. No. 463,934, now U.S. Pat. No. 4,536,795, of which the assignee is the same as the assignee of the present application, the input horizontal transfer register, the vertical transfer registers and the output horizontal transfer register are constituted by cells of charge coupled devices (CCDs) which are arranged in a (n+1) row by m column matrix arrangement, where m and n are natural numbers. m cells in the first row of the matrix arrangement constitute the input horizontal transfer register. (n−1)xm cells in the second through n-th rows of the matrix arrangement constitute m columns of the vertical transfer registers. Further, m cells in the (n+1)-th row of the matrix arrangement constitute the output horizontal transfer register.

The input and output horizontal transfer registers are supplied with a horizontal transfer pulse which is generated based on a horizontal synchronizing signal within the input composite video signal. A data obtained by sampling the input composite video signal by the horizontal transfer pulse, is successively transferred horizontally within the input horizontal transfer register every time a horizontal transfer pulse is supplied thereto. m sampled data are supplied from the input horizontal transfer register to the vertical transfer registers in parallel through the input vertical transfer gate, and the m sampled data are successively transferred vertically within the respective vertical transfer registers at a rate of once for 1H responsive to a vertical transfer pulse which is generated based on a vertical synchronizing signal within the input composite video signal. Hence, the m sampled data stored in the input horizontal transfer register are supplied to the output horizontal transfer register after n vertical transfers in the vertical transfer registers. The m sampled data stored in the output horizontal transfer register are thereafter transferred horizontally responsive to the horizontal transfer pulse, so that the m sampled data are serially supplied to the lowpass filter. As a result, a composite video signal which is delayed by n horizontal scanning periods (nH) is obtained from the lowpass filter and is produced through the output terminal.

However, the conventional video signal delay circuit has a fixed delay time determined by the number of rows (number of stages which is (n−1) in the case described above) of the vertical transfer registers, and the delay time cannot be varied. Hence, a delay circuit for delaying the composite video signal by one field minus 1H (or one field plus 1H) cannot be used in common for the composite video signal employing 525 scanning lines and the composite video signal employing 625 scanning lines.

In addition, in a case where a signal processing is performed by use of the field correlation in the video signal, the conventional delay circuit can only provide a delay time which is a natural number multiple of 1H because there are a natural number of rows in the vertical transfer registers, although the number of scanning lines is equal to 262.5 for the system employing 525 scanning lines and 312.5 for the system employing 625 scanning lines and an odd number of 0.5 is introduced due to the interlaced scanning of the television video signal. Hence, the field correlation is deviated in the upward or downward direction of the picture, and an accurate field correlation does not exist.

Further, the conventional delay circuit cannot perform a horizontal transfer while a vertical transfer is being performed. Thus, there is a problem in that a signal in a time period corresponding to a time period in which the vertical transfer is performed, does not exist in the delayed composite video signal produced from the delay circuit.

On the other hand, there are cases where the conventional delay circuit is used as a one field delay circuit within a recursive type noise reduction circuit which performs a noise reduction by use of the field correlation. In order to obtain a desired improvement of the signal-to-noise ratio in the noise reduction circuit, it is essential that the delay time of the one field delay time is accurately equal to one field plus 0.5H (or one field minus 0.5H), and delay times of other elements in the recursive loop must be equal to zero. However, in the conventional delay circuit, the output signal of the output horizontal transfer register is delayed by the lowpass filter. Moreover, another lowpass filter is provided in the input stage of the semiconductor delay circuit part for the purpose of limiting the band of the input composite video signal so that aliasing noise is not generated in the semiconductor delay circuit part. Hence, another delay is introduced by this other lowpass filter. Accordingly, even when a delay time of one field plus 0.5H (or one field minus 0.5H) is accurately obtained from the semiconductor delay circuit part of the conventional delay circuit, slight delays are inevitably introduced by the lowpass filters provided in the input and output stages of the semiconductor delay circuit part. Therefore, there is a problem in that the noise reduction circuit cannot be operated in an optimum state.

The frequency component of the horizontal transfer pulse has a frequency which is slightly higher than twice the upper limit frequency of the band in which the input composite video signal is to be transmitted. For this reason, the lowpass filter for eliminating the frequency component of the horizontal transfer pulse, which is coupled to the output stage of the output horizontal transfer register, must have narrow band and a steep cutoff frequency characteristic so as to sufficiently block the transmission of the frequency component. As a result, there is a problem in that the circuit construction of the lowpass filter is complex and the lowpass filter is expensive.

SUMMARY OF THE INVENTION

Accordingly, it is a general object of the present invention to provide a novel and useful video signal delay circuit in which the problems described heretofore are eliminated.

Another and more specific object of the present invention is to provide a video signal delay circuit in which the number of stages of vertical transfer registers is selected to such a value that a composite video signal delayed by M horizontal scanning periods is obtained from an output horizontal transfer register when a vertical transfer clock pulse is generated from a vertical transfer clock pulse generating circuit at a rate of once per horizontal scanning period, where M is a natural number. When obtaining a delay time of Na horizontal scanning periods, where Na is a natural number less than M, the vertical transfer clock pulse generating circuit generates the vertical transfer clock pulse at a rate of once per horizontal scanning period of the input composite video signal and further generates the vertical transfer clock pulse a total of (M−Na) times at specific positions within Na horizontal scanning periods of the input composite video signal. When obtaining a delay time of Nb horizontal scanning periods, where Nb is a natural number less than M and greater than M/2, the vertical transfer clock pulse generating circuit generates the vertical transfer clock pulse at a rate of once per horizontal scanning period of the input composite video signal during (2Nb−M) specific horizontal scanning periods of the input composite video signal out of the Nb horizontal scanning periods of the input composite video signal and generates the vertical transfer clock pulse at a rate of twice per horizontal scanning period of the input composite video signal during the remaining (M−Nb) horizontal scanning periods.

According to the video signal delay circuit of the present invention, it is possible to selectively obtain two or more delay times without modifying the construction of a semiconductor delay circuit part, and a desired delay time can be obtained by the same circuit regardless of whether the input composite video signal to be delayed is a composite video signal employing 525 scanning lines or 625 scanning lines. In addition, it is possible to alternately provide delays of one field plus 0.5H and one field minus 0.5H for every one field, for example. Hence, when the video signal delay circuit is used as a one field delay circuit within a recursive noise reduction circuit which uses the field correlation to reduce the noise, for example, it is possible to eliminate the smear which is generated in the reproduced picture in the case of the conventional recursive noise reduction circuit. Further, according to the video signal delay circuit of the present invention, the input composite video signal or a constant voltage (for example, the pedestal level or the synchronizing tip level within the vertical transfer period) is selectively produced during the vertical transfer period, and there is no signal lack during the vertical transfer period. No irregularities are generated in the reproduced picture because the switching (changing) of the delay time is performed during the vertical blanking period. Moreover, it is possible to compensate for the information lack that occurs when the switching of the delay time is performed for every one field.

Still another object of the present invention is to provide a video signal delay circuit in which the number of stages of vertical transfer registers is selected to such a value that a composite video signal delayed by M horizontal scanning periods is obtained from an output horizontal transfer register when a vertical transfer clock pulse is generated from a vertical transfer clock pulse generating circuit at a rate of once per horizontal scanning period, where M is a natural number. Between a first phase of an output horizontal transfer pulse with respect to an input horizontal transfer pulse and a second phase of an output vertical transfer gate pulse with respect to an input vertical transfer gate pulse, at least the first phase is advanced or retarded by a time period t, where t is less than one horizontal scanning period and is greater than zero, or the horizontal transfer clock pulse generating circuit generates a predetermined number of input and output horizontal transfer clock pulses during one horizontal scanning period of the composite video signal excluding time periods in which input and output vertical transfer clock pulses are generated, which predetermined number is greater than the number of columns m in each of the input and output horizontal transfer registers, where m is a natural number.

According to the video signal delay circuit of the present invention, it is possible to obtain a delay time which is the time period t shorter (or longer) than M horizontal scanning periods. Hence, when the video signal delay circuit of the present invention is applied to a recursive noise reduction circuit which uses the field correlation to reduce the noise, it is possible to design the noise reduction circuit so that a desired delay time is obtainable by taking into account a delay time of a filter circuit within the noise reduction circuit. Moreover, it is possible to compensate for a signal lack during the vertical transfer and for a signal lack which is introduced when the horizontal transfer is performed by generating within one horizontal scanning period a number of horizontal transfer clock pulses greater than the number of columns in the horizontal transfer registers.

A further object of the present invention is to provide a video signal delay circuit in which the horizontal transfer clock pulse generating circuit is constituted by oscillator means for producing a signal having a frequency related to the frequency of the horizontal transfer clock pulse, which oscillator means is forcibly reset by a horizontal synchronizing signal within the input composite video signal, and circuit means for producing as the horizontal transfer clock pulse a signal which is generated from the output signal of the oscillator means and has a frequency equal to the repetition frequency of the horizontal transfer clock pulse and a phase which is inverted for every one horizontal scanning period of the input composite video signal.

According to the video signal delay circuit of the present invention, a lack of the horizontal transfer clock pulse within the delayed composite video signal is inconspicuous in the reproduced picture because the horizontal transfer clock pulse component is in a frequency interleaved relationship to the horizontal scanning frequency. For this reason, the band of the lowpass filter for eliminating the frequency component of the horizontal transfer clock pulse can be widened to a certain extent compared to the conventional circuit. As a result, the lowpass filter need not have a steep cutoff frequency characteristic as in the case of the conventional circuit, and an inexpensive lowpass filter having a simple circuit construction can be used in the video signal delay circuit of the present invention.

Other objects and further features of the present invention will be apparent from the following detailed description when read in conjunction with the accompanying drawings.

BRIEF DESCRIPTION OF THE DRAWINGS

FIG. 12 is a system block diagram showing a third embodiment of the video signal delay circuit according to the present invention;

FIGS. 14(A) through 14(H) show signal waveforms for explaining the operation of the third embodiment shown in FIG. 12;

FIG. 15 is a system block diagram showing a fourth embodiment of the video signal delay circuit according to the present invention;

DETAILED DESCRIPTION

Figure 1:
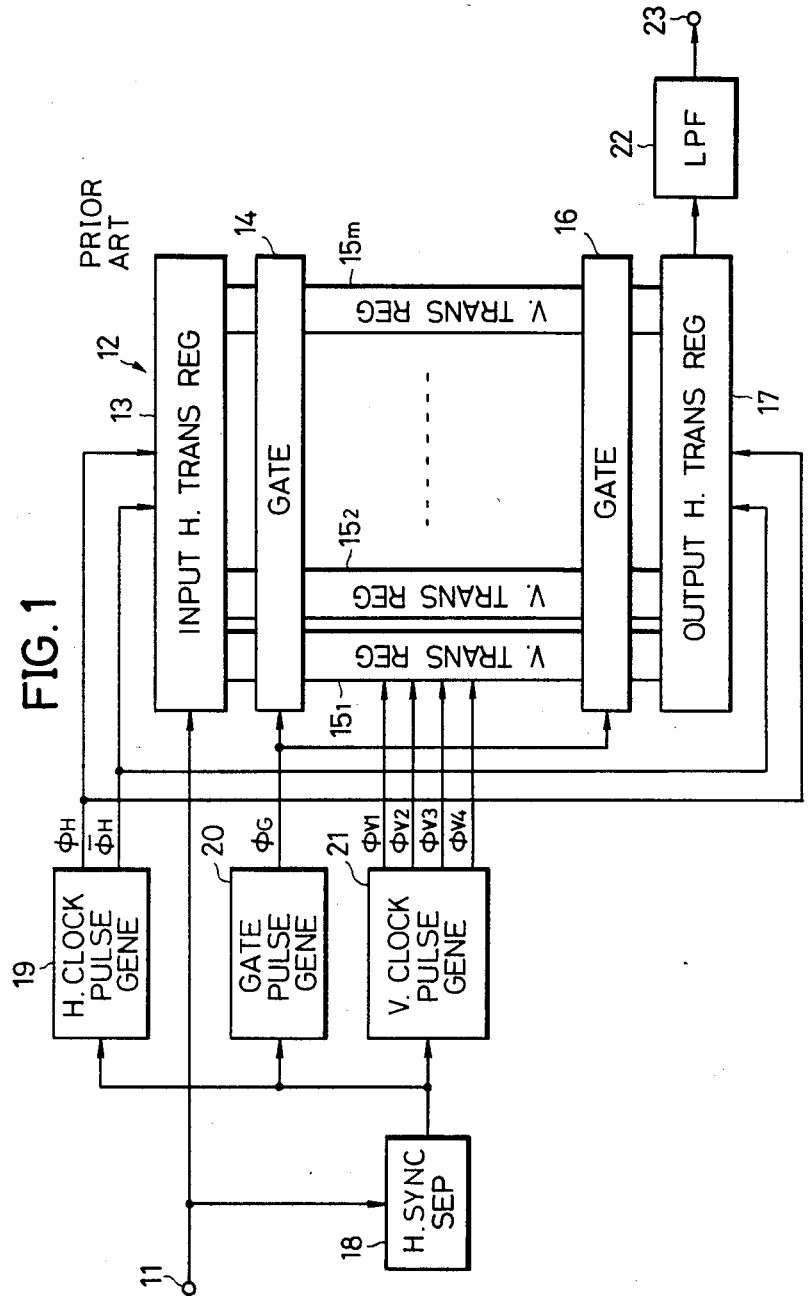
FIG. 1 is a system block diagram showing an example of a conventional video signal delay circuit.
Figure 2:
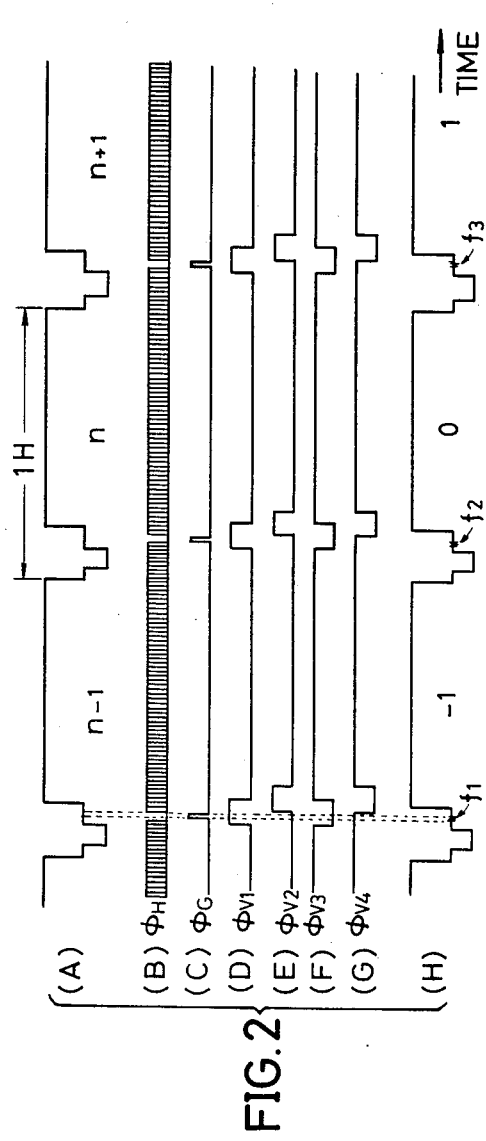
FIGS. 2(A) through 2(H), FIGS. 3(A) through 3(D) and FIGS. 4(A) through 4(C) respectively show signal waveforms for explaining the operation of the block system shown in FIG. 1.

First, a description will be given with respect to an example of a conventional video signal delay circuit, by referring to FIG. 1. In FIG. 1, an input composite video signal shown in FIG. 2(A) is applied to an input terminal 11. The input composite video signal is supplied to an input horizontal transfer register 13 within a semiconductor delay circuit part 12 and to a horizontal synchronizing signal separating circuit 18. The semiconductor delay circuit part 12 comprises the input horizontal transfer register 13, an input vertical transfer gate 14, m columns of vertical transfer registers $15_1$ through $15_m$, where m is a natural number, an output vertical transfer gate 16, and an output horizontal transfer register 17.

For example, the registers 13, $15_1$ through $15_m$ and 17 are constituted by a plurality of cells of charge coupled devices (CCDs), and for the reason which will be described later on in the specification, 455 cells are arranged horizontally in each of the horizontal transfer registers 13 and 17. Hence, the number of columns m of the vertical transfer registers $15_1$ through $15_m$ is equal to 455. For example, the vertical transfer registers $15_1$ through $15_m$ each has 261 stages (that is, $26a$ cells arranged vertically), and a delay time of 262 horizontal scanning periods (262H) is obtained by performing one vertical transfer in one horizontal scanning period (1H).

On the other hand, a horizontal synchronizing signal obtained from the horizontal synchronizing signal separating circuit 18 is supplied to a horizontal transfer clock pulse generating circuit 19, a vertical transfer gate pulse generating circuit 20 and a vertical transfer clock pulse generating circuit 21. The horizontal transfer clock pulse generating circuit 19 generates a horizontal transfer clock pulse $\phi_H$ shown in FIG. 2(B) and a pulse $\overline{\phi_H}$ (not shown) having an inverted phase of the horizontal clock pulse $\phi_H$, and supplies the pulses $\phi_H$ and $\overline{\phi_H}$ to the input and output horizontal transfer registers 13 and 17. The vertical transfer gate pulse generating circuit 20 generates a gate pulse $\phi_G$ shown in FIG. 2(C) which assumes a high level only during a predetermined time period (time period in which the horizontal transfer pulses $\phi_H$ and $\overline{\phi_H}$ are not generated) within a back porch of the input composite video signal, and supplies the gate pulse $\phi_G$ to the input and output vertical transfer gates 14 and 16.

The vertical transfer clock pulse generating circuit 21 generates vertical transfer clock pulses $\phi_{V1}$, $\phi_{V2}$, $\phi_{V3}$ and $\phi_{V4}$ shown in FIGS. 2(D), 2(E), 2(F) and 2(G) having four different phases, once for every 1H. The vertical transfer clock pulses $\phi_{V1}$, $\phi_{V2}$, $\phi_{V3}$ and $\phi_{V4}$ are supplied to the vertical transfer registers $15_1$ through $15_m$.

The input composite video signal is transferred horizontally within the horizontal transfer register 13 responsive to the horizontal transfer clock pulses $\phi_H$ and $\overline{\phi_H}$ and are stored in the horizontal transfer register 13. Hence, the information stored in the horizontal transfer register 13 is essentially a signal obtained by sampling the input composite video signal by the horizontal transfer pulses $\phi_H$ and $\overline{\phi_H}$. When it is assumed that the band of the input composite video signal is in the range of zero to 2.5 MHz, the sampling frequency (that is, the horizontal transfer frequency) must be over 5 MHz according to the sampling theorem. In the present case, the horizontal transfer frequency is set to 7.16 MHz which is 455 times the horizontal scanning frequency $f_H$. The vertical transfer is performed during a time period in the order of 1 $\mu$sec within 1H ($\approx$63.5 $\mu$sec), and the horizontal transfer cannot be performed during the vertical transfer period in which the vertical transfer is performed. Thus, the semiconductor delay circuit part 12 is designed so that the horizontal transfer is not performed during a time period of 1.4 $\mu$sec in which the vertical transfer gates 14 and 16 open.

Figure 3:
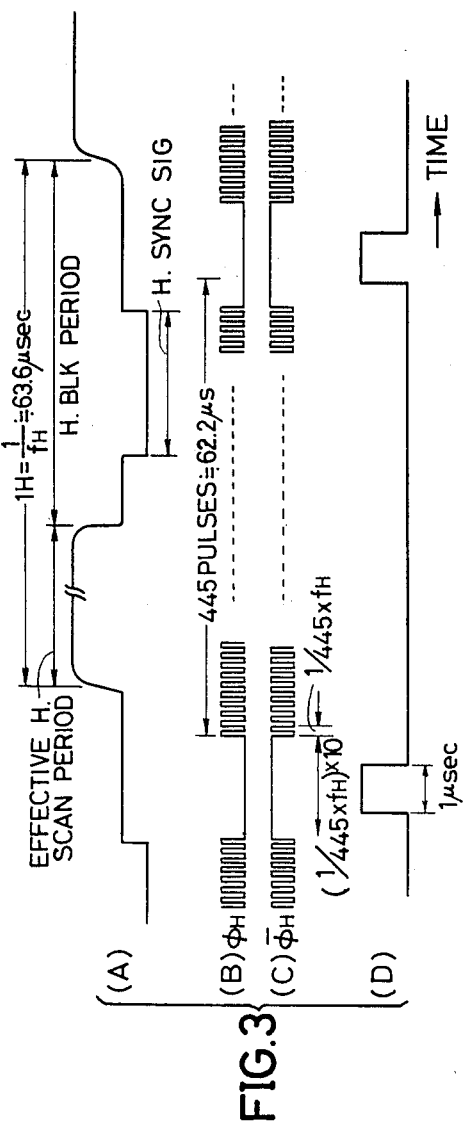

As shown in FIG. 3(D), the vertical transfer gate pulse $\phi_G$ is positioned within the horizontal blanking period of the input composite video signal shown in FIG. 3(A), and the horizontal transfer clock pulses $\phi_H$ and $\overline{\phi_H}$ assume constant levels during a time period of 1.4 $\mu$sec including the time period in which the vertical transfer gate pulse $\phi_G$ is generated, as shown in FIGS. 3(B) and 3(C) so that the horizontal transfer is not performed during this time period of 1.4 $\mu$sec. This time period of 1.4 $\mu$sec corresponds to 10 periods (10 pulses) of the horizontal transfer clock pulses $\phi_H$ and $\overline{\phi_H}$. Accordingly, 445 (=455−10) horizontal transfer clock pulses $\phi_H$ and $\overline{\phi_H}$ are generated within 1H. The number of stages (cells) in the horizontal transfer registers 13 and 17 must be selected so that the input composite video signal is stored to the capacity when 445 horizontal transfer clock pulses are generated. Therefore, the number of stages in the horizontal transfer registers 13 and 17 is selected to 445.

The input composite video signal is transferred horizontally within the input horizontal transfer register 13 by the 445 horizontal transfer clock pulses $\phi_H$ and $\overline{\phi_H}$ having a period of $1/(445f_H)$. Thereafter, the input vertical transfer gate 14 is opened by the vertical transfer gate pulse $\phi_G$ having the width of 1 $\mu$sec, and the 445 sampled information stored in the input horizontal transfer register 13 are supplied in parallel to the respective 445 columns of vertical transfer registers $15_1$ through $15_m$, where m=445 in this case. The vertical transfer registers $15_1$ through $15_m$ transfer the incoming sampled information to a subsequent stage (subsequent row) every time the four vertical transfer clock pulses $\phi_{V1}$ through $\phi_{V4}$ are applied thereto. After 262 vertical transfers take place in the vertical transfer registers $15_1$ through $15_m$, the 445 sampled information are supplied in parallel to the output horizontal transfer register 17 through the output vertical transfer gate 16. The output horizontal transfer register 16 serially produces the parallel sampled information within 1H, based on the horizontal transfer clock pulses $\phi_H$ and $\overline{\phi_H}$. The serial output of the output horizontal transfer register 16 is passed through a lowpass filter 22 and is obtained from an output terminal 23. The lowpass filter 22 is provided for the purpose of eliminating the frequency component of the horizontal transfer clock pulses $\phi_H$ and $\overline{\phi_H}$.

Therefore, the input composite video signal is delayed by 262H and is obtained from the output terminal 23.

Figure 4:
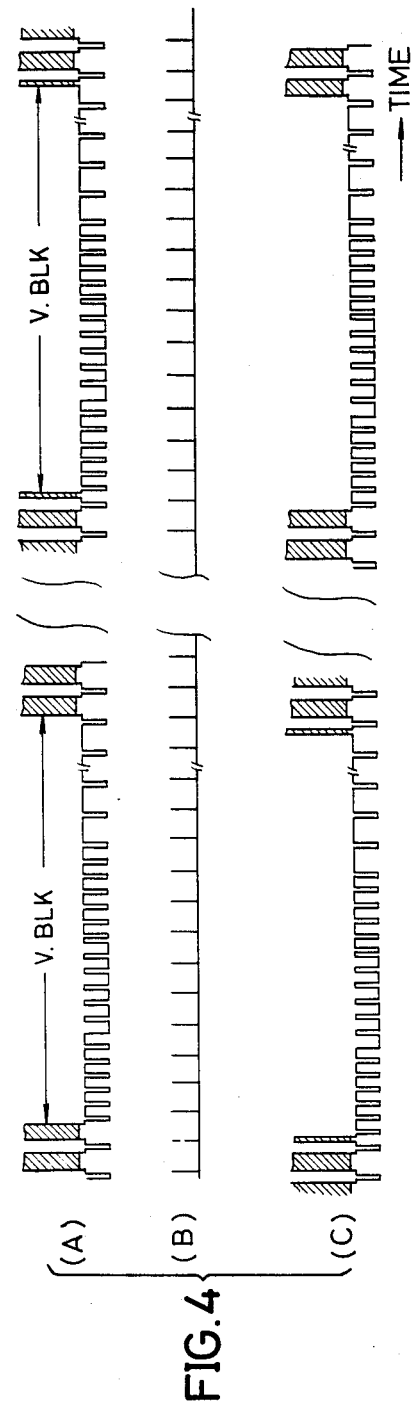

In a case where the input composite video signal is a composite video signal employing 525 scanning lines and the input composite video signal is to be delayed by one field minus 0.5H, the value of m is selected to 262. When it is assumed that the input composite video signal has a waveform shown in FIG. 4(A) in a vicinity of the vertical blanking period (V. BLK) and the vertical transfer clock pulse $\phi_{V1}$ has a waveform shown in FIG. 4(B), a composite video signal which is delayed by 262H and has a waveform shown in FIG. 4(C) is obtained from the output terminal 23.

Figure 5:
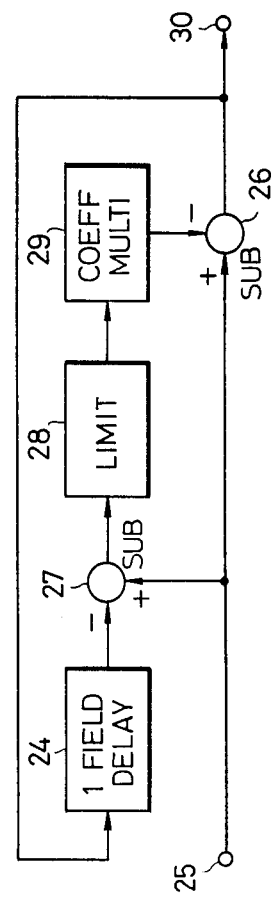
FIG. 5 is a system block diagram showing an example of a recursive noise reduction circuit which uses field correlation to reduce noise.

The conventional video signal delay circuit described heretofore may be used as a one field delay circuit 24 within a recursive noise reduction circuit shown in FIG. 5 which uses field correlation to reduce the noise. In FIG. 5, a reproduced composite video signal applied to an input terminal 25 is supplied to subtracting circuits 26 and 27. The subtracting circuit 27 subtracts from the reproduced composite video signal an output composite video signal of the noise reduction circuit delayed by 262H in the one field delay circuit 24. Noise and the like which are obtained from the subtracting circuit 27 and have no field correlation, are passed through a limiter 28 and are supplied to a coefficient multiplying circuit 29 wherein a desired weighting is performed. An output signal of the coefficient multiplying circuit 29 is supplied to the subtracting circuit 26.

Accordingly, a reproduced composite video signal in which the noise having no field correlation is greatly reduced and the signal-to-noise ratio is improved, is obtained from the subtracting circuit 26. The output signal of the subtracting circuit 26 is obtained from an output terminal 30, and is also supplied to the one field delay circuit 24.

In order to obtain a desired improvement of the signal-to-noise by the noise reduction circuit described above, the delay time of the one field delay circuit 24 must be accurately equal to 262H. Hence, delay times of other elements in the recursive loop must be equal to zero. However, the conventional video signal delay circuit shown in FIG. 1 is provided with the lowpass filter 22 and a lowpass filter which is coupled to the input stage of the semiconductor delay circuit part 12 for eliminating aliasing noise. Hence, delays are inevitably introduced in these lowpass filters, and the noise reduction circuit cannot be operated in an optimum state.

The conventional video signal delay circuit can only provide a constant delay time which is determined by the number of rows (stages) in the vertical transfer registers $15_1$ through $15_m$, and the delay time cannot be varied. For this reason, a delay circuit for delaying the composite video signal by one field minus 1H (or one field plus 1H) cannot be used in common for the composite video signal employing 525 scanning lines and the composite video signal employing 625 scanning lines.

In addition, in a case where a signal processing is performed by use of the field correlation in the video signal, the conventional video signal delay circuit can only provide a delay time which is a natural number multiple of 1H because there are a natural number of rows in the vertical transfer registers $15_1$ through $15_m$, although the number of scanning lines is equal to 262.5 for the system employing 525 scanning lines and 312.5 for the system employing 625 scanning lines and an odd number of 0.5 is introduced due to the interlaced scanning of the television video signal. Hence, the field correlation is deviated in the upward or downward direction of the picture, and an accurate field correlation does not exist.

Further, the conventional video signal delay circuit cannot perform a horizontal transfer while a vertical transfer is being performed. Thus, there is a problem in that a signal in a time period corresponding to the vertical transfer period does not exist in the delayed composite video signal produced from the delay circuit as indicated by $f_1$, $f_2$ and $f_3$ in FIG. 2(H).

Moreover, the lowpass filter 22 for eliminating the frequency component of the horizontal transfer pulse from the output delayed composite video signal of the output horizontal transfer register 17, must have narrow band and a steep cutoff frequency characteristic so as to sufficiently block the transmission of the frequency component. As a result, there is a problem in that the circuit construction of the lowpass filter 22 is complex and the lowpass filter 22 is expensive.

Next, description will be given with respect to various embodiments of the video signal delay circuit according to the present invention in which the problems of the conventional video signal delay circuit described heretofore are eliminated.

Figure 6:
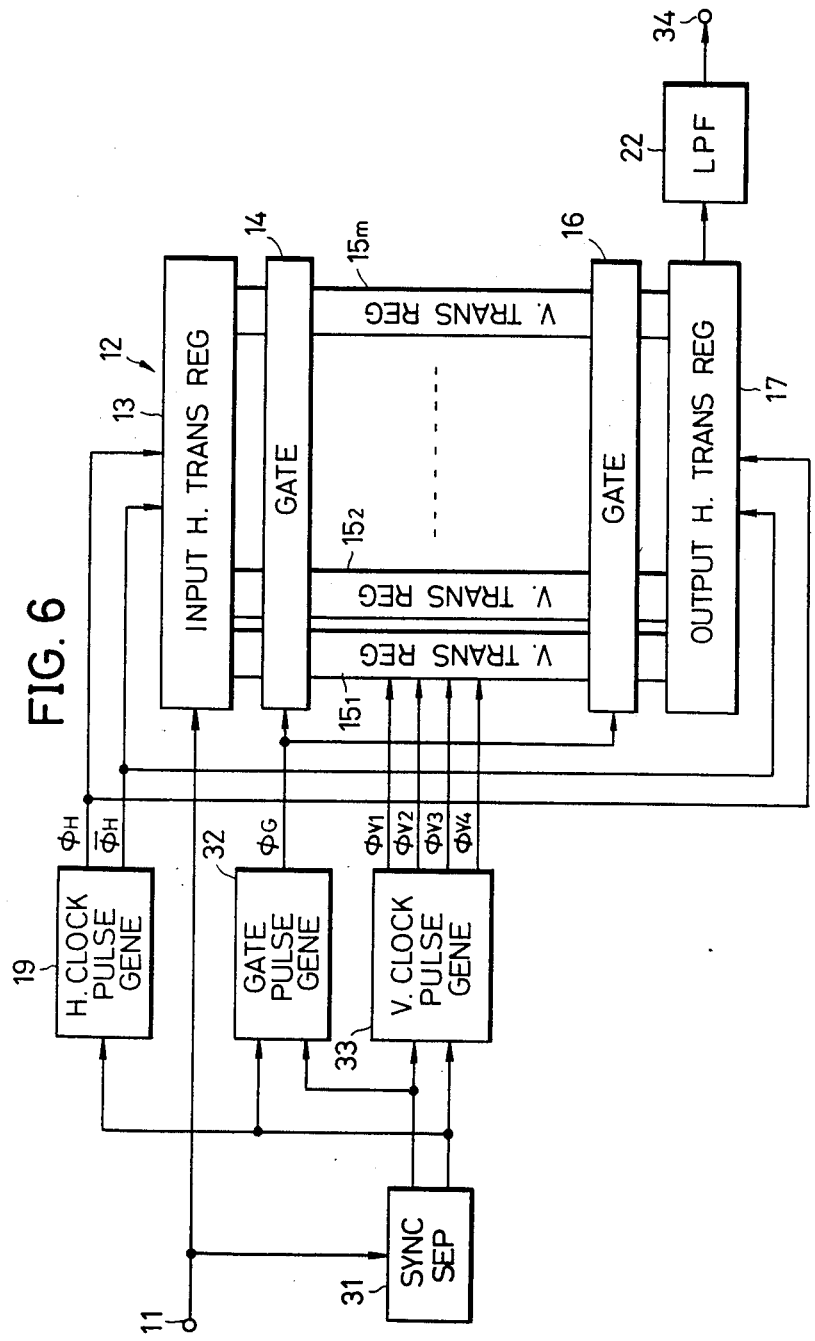
FIG. 6 is a system block diagram showing first and second embodiments of the video signal delay circuit according to the present invention.

FIG. 6 shows first and second embodiments of the video signal delay circuit according to the present invention. In FIG. 6, those parts which are the same as those corresponding parts in FIG. 1 are designated by the same reference numerals, and their description will be omitted. In FIG. 6, the input composite video signal applied to the input terminal 11 is supplied to the input horizontal transfer register 13 within the semiconductor delay circuit part 12 and to a synchronizing signal separating circuit 31. The synchronizing signal separating circuit 31 separates the horizontal and vertical synchronizing signals from the input composite video signal. The separated horizontal synchronizing signal from the synchronizing signal separating circuit 31 is supplied to the horizontal transfer clock pulse generating circuit 19, a vertical transfer gate pulse generating circuit 32 and a vertical transfer clock pulse generating circuit 33. On the other hand, the separated vertical synchronizing signal from the synchronizing signal separating circuit 31 is supplied to the vertical transfer gate pulse generating circuit 32 and the vertical transfer clock pulse generating circuit 33. In the first embodiment, the vertical transfer clock pulse generating circuit 33 has the construction of a vertical transfer clock pulse generating circuit 33-1 shown in FIG. 7. In the second embodiment, the vertical transfer clock pulse generating circuit 33 has the construction of a vertical transfer clock pulse generating circuit 33-2 shown in FIG. 9. In the description given hereinafter, the vertical transfer gate pulse $\phi_G$ is also generated in phase synchronism with the timing with which the vertical transfer clock pulses $\phi_{V1}$ through $\phi_{V4}$ are generated.

First, a description will be given with respect to the first embodiment. The vertical transfer clock pulse generating circuit 33-1 shown in FIG. 7 comprises an input terminal 40 for receiving the vertical synchronizing signal, an input terminal 41 for receiving the horizontal synchronizing signal, an input terminal 42 for receiving a drum pulse and an input terminal 43 for receiving a television system discrimination signal. The vertical synchronizing signal applied to the input terminal 40 is supplied to a timing generating circuit 44. On the other hand, the horizontal synchronizing signal applied to the input terminal 41 is supplied to the timing generator 44 and pulse generating circuits 45, 46 and 47. When it is assumed that the input composite video signal has a waveform shown in FIG. 8(A) within the vertical blanking period, the horizontal synchronizing signal applied to the input terminal 41 has a waveform shown in FIG. 8(B) and the vertical synchronizing signal applied to the input terminal 40 has a waveform shown in FIG. 8(C).

Figure 8:
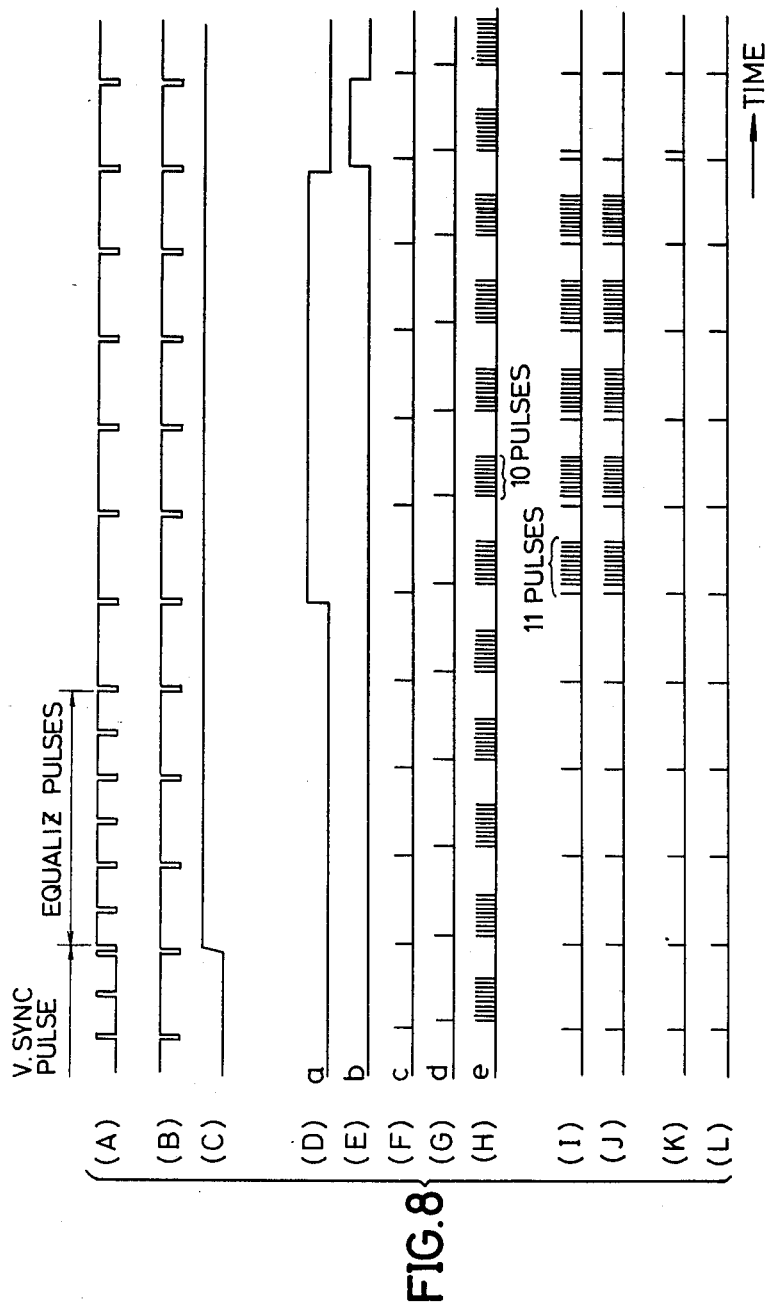
FIGS. 8(A) through 8(L) show signal waveforms for explaining the operation of the first embodiment shown in FIG. 6.

For example, the timing generating circuit 44 generates a pulse a shown in FIG. 8(D) based on the horizontal and vertical synchronizing signals supplied thereto. The pulse a assumes a high level for a time period of 5H after an equalizing pulse which is immediately after the vertical synchronizing pulse. The pulse a is supplied to an AND circuit 48. The timing generating circuit 44 also generates a pulse b shown in FIG. 8(E) which assumes a high level only for a time period of 1H from a position which is after a fall in the pulse a by a time period which is in the range of the width of the horizontal synchronizing pulse, for example. The pulse b is supplied to an AND circuit 49. The pulse generating circuit 45 generates a pulse c shown in FIG. 8(F) which is in phase synchronism with the horizontal synchronizing signal supplied thereto and has a narrow width, and this pulse c is supplied to an OR circuit 50. The pulse generating circuit 46 generates a pulse d shown in FIG. 8(G) which is delayed by an extremely small predetermined time with respect to the pulse c and has a narrow width, and this pulse d is supplied to the AND circuit 49. The pulses c and d are each generated once within the time period of 1H. The pulse generating circuit 47 generates a pulse e shown in FIG. 8(H) having an extremely small width immediately after the pulse c. Ten of such pulses e are generated time-sequentially within the same time period of 1H in which the pulse c is generated once. The pulse e is supplied to the AND circuit 48.

The AND circuit 48 performs a logical multiplication of the pulses a and e and the television system discrimination signal from the input terminal 43, and supplies an output signal to the OR circuit 50. The television system discrimination signal is a binary signal indicating whether the input composite video signal is of the system employing 525 scanning lines or 625 scanning lines. The television system discrimination signal assumes a high level when the input composite video signal is of the system employing 525 scanning lines and assumes a low level when the input composite video signal is of the system employing 625 scanning lines. On the other hand, the AND circuit 49 performs a logical multiplication of the pulses b and d and the drum pulse from the input terminal 42, and supplies an output signal of the OR circuit 50. In the present embodiment, the video signal delay circuit is applied to a video tape recorder (VTR), and as is well known, the drum pulse is in phase synchronism with the rotation of rotary heads and is a symmetrical square wave having a period of two fields.

The OR circuit obtains a logical sum of the output signals of the AND circuits 48 and 49 and the pulse c, and supplies an output signal to an output terminal 52 as the vertical transfer clock pulse $\phi_{V1}$. The output signal of the OR circuit 50 is passed through an inverter 53 and is supplied to an output terminal 54 as the vertical transfer clock pulse $\phi_{V3}$. Further, the output signal of the OR circuit 50 is delayed by a predetermined delay time in a delay circuit 51, which predetermined delay time is in such a range that the vertical transfer gate pulse $\phi_G$ does not exist within the high-level period of the output signal of the OR circuit 50. An output signal of the delay circuit 51 is supplied to an output terminal 55 as the vertical transfer clock pulse $\phi_{V2}$. The output signal of the delay circuit 51 is also passed through an inverter 56 and is supplied to an output terminal 57 as the vertical transfer clock pulse $\phi_{V4}$. Accordingly, the phase relationships of the vertical transfer clock pulses $\phi_{V1}$, $\phi_{V2}$, $\phi_{V3}$ and $\phi_{V4}$ with respect to the vertical transfer gate pulse $\phi_G$ and the like are the same as those of the vertical transfer clock pulses $\phi_{V1}$, $\phi_{V2}$, $\phi_{V3}$ and $\phi_{V4}$ shown in FIGS. 2(D), 2(E), 2(F) and 2(F) which are obtained in the conventional video signal delay circuit described before.

The vertical transfer clock pulses $\phi_{V1}$ through $\phi_{V4}$ are supplied to the vertical transfer registers $15_1$ through $15_m$ shown in FIG. 6. For example, the vertical transfer registers $15_1$ through $15_m$ each has 312 stages (rows). Thus, when one vertical transfer is performed for every time period of 1H, a composite video signal which is delayed by 313H is produced from the output horizontal transfer register 17, passed through the low-pass filter 22 and is obtained from an output terminal 34.

When it is assumed that the input composite video signal is of the system employing 625 scanning lines, the output signal of the AND circuit 48 constantly assumes a low level. Thus, during a time period of one field in which the drum pulse from the input terminal 42 assumes a high level, the vertical transfer clock pulses $\phi_{V1}$, $\phi_{V2}$, $\phi_{V3}$ and $\phi_{V4}$ from the respective output terminals 52, 54, 55 and 57 are obtained twice during a time period of 1H in which the pulse b assumes a high level and are obtained once during other time periods of 1H, as may be seen from FIG. 8(K) with respect to the vertical transfer clock pulse $\phi_{V1}$. On the other hand, during a time period of one field in which the drum pulse from the input terminal 42 assumes a low level, the pulse c is produced as the vertical transfer clock pulses $\phi_{V1}$ through $\phi_{V4}$ as shown in FIG. 8(L) and the vertical transfer clock pulses $\phi_{V1}$ through $\phi_{V4}$ are obtained once during each time period of 1H. Accordingly, the delay time is equal to 312H when the drum pulse assumes the high level and is equal to 313H when the drum pulse assumes the low level, and the delay time alternately switches (changes) between 313H and 312H for every time period of one field.

On the other hand, in a case where the input composite video signal is of the system employing 525 scanning lines, a high-level television system discrimination signal is applied to the input terminal 43. Hence, ten pulses e are obtained from the AND circuit 48 during each of the time periods of 1H over the time period of 5H within the vertical blanking period in which the pulse a assumes a high level. Accordingly, the delay time obtained in the semiconductor delay circuit part 12 in this case is equal to 262H (=313H−51H) during the high-level period of the drum pulse, because the vertical transfer clock pulse $\phi_{V1}$ from the output terminal 52 is obtained eleven times during each of the time periods of 1H over the time period of 5H in which the pulse a assumes a high level, is obtained twice during the time period of 1H in which the pulse b assumes a high level and is obtained once during each of the remaining time periods of 1H as shown in FIG. 8(I). The delay time obtained in the semiconductor delay circuit part 12 is equal to 253H (=313H−50H) during the low-level period of the drum pulse, because the vertical transfer clock pulse $\phi_{V1}$ is obtained eleven times only during each of the time periods of 1H over the time period of 5H in which the pulse a assumes a high level and is obtained once during each of the remaining time periods of 1H as shown in FIG. 8(J). In this case, the delay time alternately switches between 262H and 263H for every time period of one field.

According to the present embodiment, when obtaining a delay time of 312H, 263H or 263H which is smaller than 313H, the vertical transfer is performed once for every time period of 1H, and in addition, a total of (313−N) vertical transfers are performed due to additional vertical transfers performed at specific positions (specific time periods of 1H) within the time period of NH, where N is a natural number and NH represents the desired delay time. Further, according to the present embodiment, the delay time is alternately switched between a delay time of one field plus 0.5H and a delay time of one field minus 0.5H for every one field. Hence, the smear will not be generated in the reproduced picture when the delay circuit is used in the recursive noise reduction circuit shown in FIG. 5 which uses the field correlation to reduce the noise. When the switching of the delay time for every one field is not required, a high-level or low-level signal may be constantly supplied to the input terminal 42.

Figure 7:
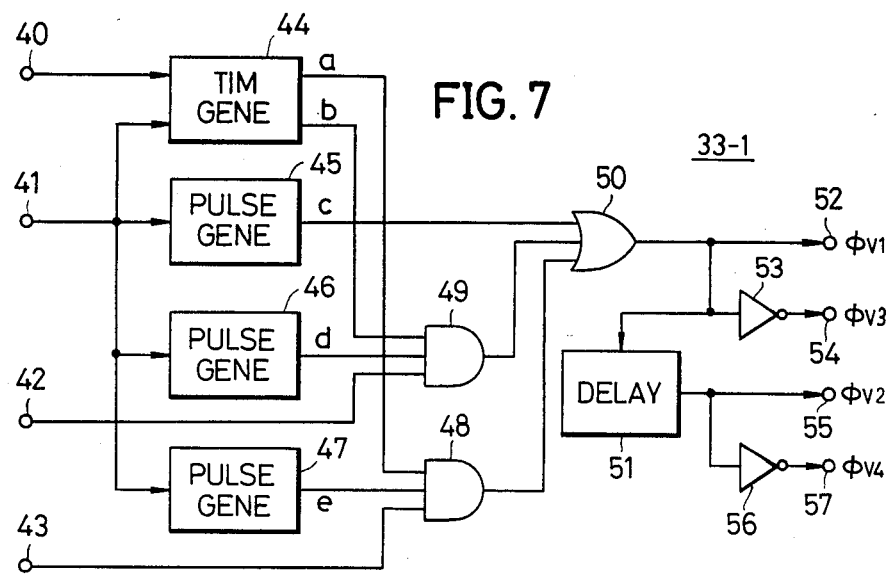
FIG. 7 is a system circuit diagram showing an essential part of the first embodiment shown in FIG. 6.
Figure 9:
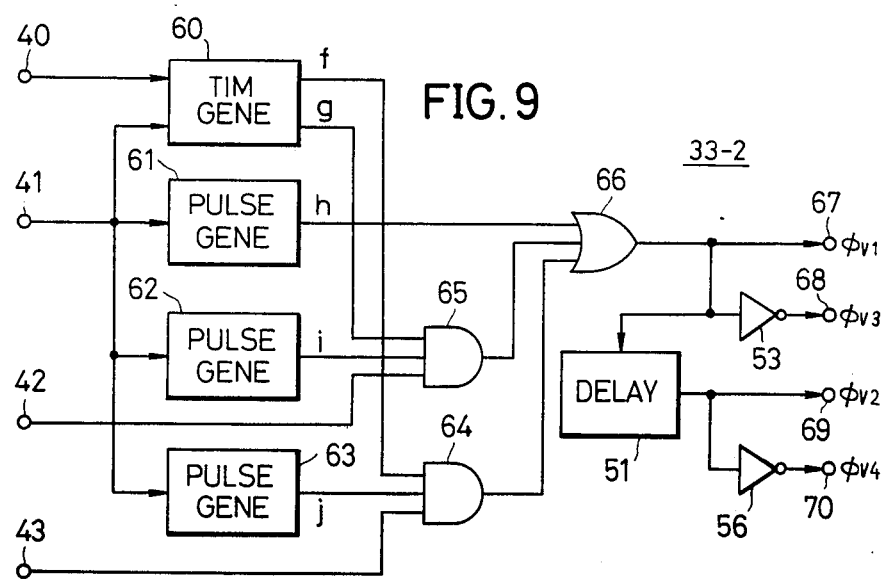
FIG. 9 is a system circuit diagram showing an essential part of the second embodiment shown in FIG. 6.
Figure 10:
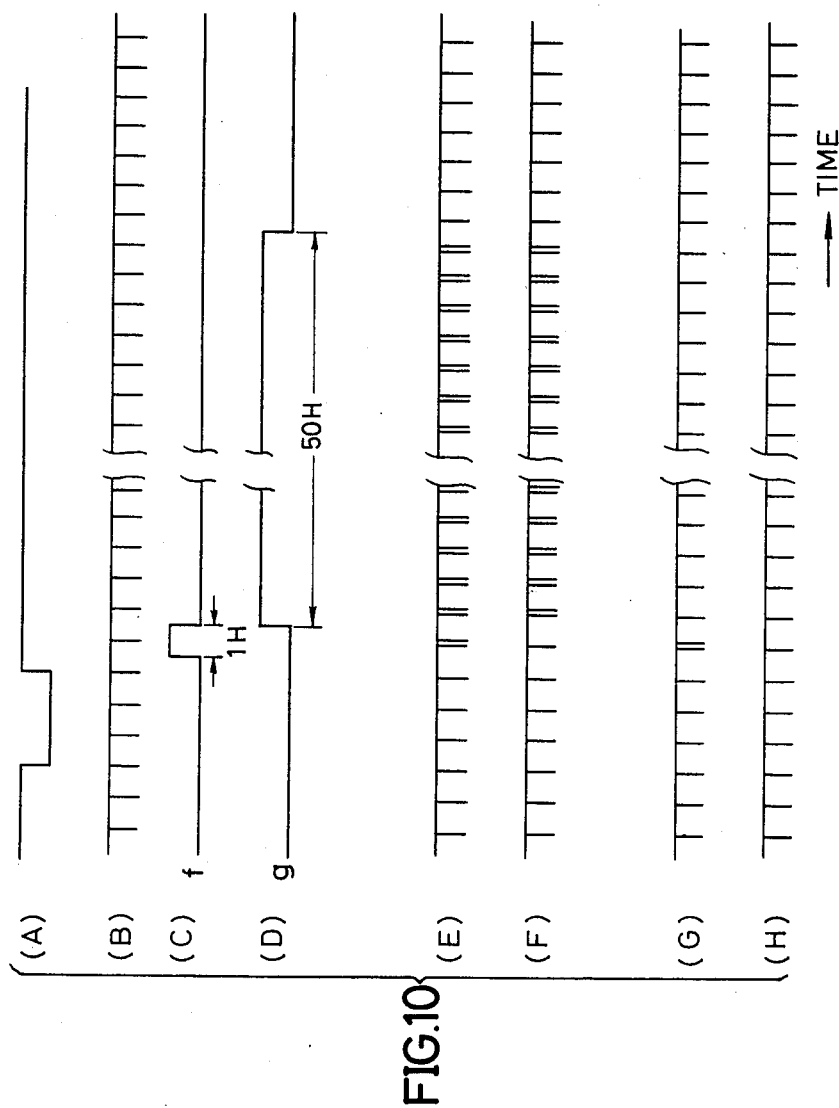
FIGS. 10(A) through 10(H) and FIGS. 11(A) through 11(D) respectively show signal waveforms for explaining the operation of the second embodiment shown in FIG. 6.
Figure 11:
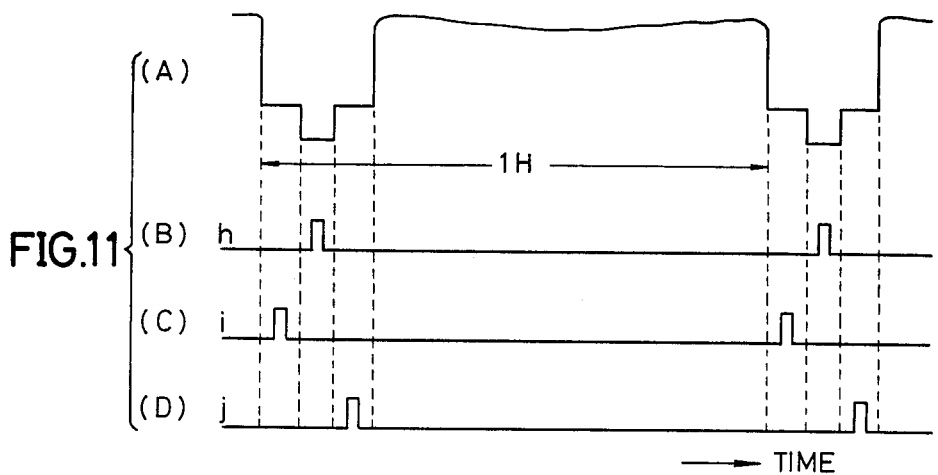

Next, a description will be given with respect to the second embodiment of the video signal delay circuit according to the present invention by referring to the vertical transfer clock pulse generating circuit 33-2 shown in FIG. 9. In FIG. 9, those parts which are the same as those corresponding parts in FIG. 7 are designated by the same reference numerals, and their description will be omitted. A vertical synchronizing signal shown in FIG. 10(A) and a horizontal synchronizing signal shown in FIG. 10(B) are respectively supplied to a timing generating circuit 60. The timing generating circuit 60 generates a pulse f shown in FIG. 10(C) which assumes a high level only during a time period of 1H immediately after the vertical synchronizing signal and has a period of one field. The timing generating circuit 60 also generates a pulse g shown in FIG. 10(D) which rises responsive to a fall in the pulse f and has a high-level period of 50H, for example. When it is assumed that the input composite video signal has a waveform shown in FIG. 11(A), pulse generating circuits 61, 62 and 63 generate pulses h, i and j which assume high levels at mutually different positions within the horizontal blanking period.

An AND circuit 64 performs a logical multiplication of the pulses f and j and the television system discrimination signal from the input terminal 43, and supplies an output signal to an OR circuit 66. An AND circuit 65 performs a logical multiplication of the pulses g and i and the drum pulse from the input terminal 42, and supplies an output signal to the OR circuit 66. The OR circuit 66 obtains a logical sum of the output signals of the AND circuits 65 and 66 and the pulse h. An output signal of the OR circuit 66 is supplied to an output terminal 67 as the vertical transfer clock pulse $\phi_{V1}$. The output signal of the OR circuit 66 is passed through the inverter 53 and is supplied to an output terminal 68 as the vertical transfer clock pulse $\phi_{V3}$. Further, the output signal of the OR circuit 66 is supplied to the delay circuit 51, and the output signal of the delay circuit 51 is supplied to an output terminal 69 as the vertical transfer clock pulse $\phi_{V2}$. The output signal of the delay circuit 51 is passed through the inverter 56 and the output signal of the inverter 56 is supplied to an output terminal 70 as the vertical transfer clock pulse $\phi_{V4}$.

In the case where the input composite video signal is of the system employing 525 scanning lines and the drum pulse assumes a high level, the vertical transfer clock pulse $\phi_{V1}$ from the output terminal 67 is obtained twice during every time period of 1H over a total time period of 51H in which the pulse f or g assumes a high level, and is obtained once during every time period of 1H over the remaining time period of 211H, as shown in FIG. 10(E). On the other hand, when the drum pulse assumes a low level, the vertical transfer clock pulse $\phi_{V1}$ is obtained twice during every time period of 1H only over the time period of 50H in which the pulse g assumes a high level, and is obtained once during every time period of 1H over the remaining time period of 212H. The vertical transfer clock pulses $\phi_{V2}$, $\phi_{V3}$ and $\phi_{V4}$ are obtained similarly. Accordingly, the delay time obtained in the semiconductor delay circuit part 12 in this case is equal to 262H during the time period of one field in which the vertical transfer clock pulse $\phi_{V1}$ shown in FIG. 10(E) is obtained and is equal to 263H during the subsequent time period of one field in which the vertical transfer clock pulse $\phi_{V1}$ shown in FIG. 10(F) is obtained. In other words, the delay time is alternately switched for every time period of one field.

On the other hand, in the case where the input composite video signal is of the system employing 625 scanning lines and the drum pulse assumes a high level, the vertical transfer clock pulse $\phi_{V1}$ from the output terminal 67 is obtained twice only during the time period of 1H in which the pulse f assumes a high level and is obtained once during every time period of 1H over the remaining time period of 312H, as shown in FIG. 10(G). When the drum pulse assumes a low level, the vertical transfer clock pulse $\phi_{V1}$ is obtained once during every time period of 1H over the entire time period of 313H, as shown in FIG. 10(H). The vertical transfer clock pulses $\phi_{V2}$, $\phi_{V3}$ and $\phi_{V4}$ are obtained similarly. In this case, the delay time is equal to 312H during the time period of one field in which the vertical transfer clock pulse $\phi_{V1}$ shown in FIG. 10(G) is obtained and is equal to 313H during the subsequent time period of one field in which the vertical transfer clock pulse $\phi_{V1}$ shown in FIG. 10(H) is obtained.

According to the present embodiment, the delay time of 313H is obtained when the vertical transfer clock pulses $\phi_{V1}$ through $\phi_{V4}$ are obtained once for every time period of 1H. When obtaining the delay time of 312H, 263H or 262H which is smaller than 313H, the vertical transfer clock pulses $\phi_{V1}$ through $\phi_{V4}$ are obtained once for every time period of 1H during a time period of (2N−313)H out of a time period of NH, and the vertical transfer clock pulses $\phi_{V1}$ through $\phi_{V4}$ are obtained twice for every time period of 1H during the remaining time period of (313−N), where N is a natural number and NH represents the desired delay time.

Next, a description will be given with respect to a third embodiment of the video signal delay circuit according to the present invention, by referring to FIG. 12 which is a system block diagram showing the third embodiment. In FIG. 12, those parts which are the same as those corresponding parts in FIG. 6 are designated by the same reference numerals, and their description will be omitted. In FIG. 12, a vertical transfer clock pulse generating circuit 73 supplies the vertical transfer clock pulses $\phi_{V1}$ through $\phi_{V4}$ to the vertical transfer registers $15_1$ through $15_m$, and supplies a switching pulse to a switching circuit 74. The output signal of the output horizontal transfer register 17 is applied to a terminal 74a of the switching circuit 74, and the input composite video signal from the input terminal 11 is applied to a terminal 74b of the switching circuit 74. The switching circuit 74 selectively passes one of the signals applied to the terminals 74a and 74b thereof, and an output signal of the switching circuit 74 is supplied to the output terminal 34 through the lowpass filter 22.

As described before, the horizontal transfer cannot be performed while the vertical transfer is being performed by the vertical transfer clock pulses $\phi_{V1}$ through $\phi_{V4}$. Hence, there is a signal lack in the output signal of the output horizontal transfer register 17 during the vertical transfer period. In addition, in the case where the delay time is to be alternately switched between the delay time of one field plus 0.5H and the delay time of one field minus 0.5H for every time period of one field, there is a signal lack in the output signal over a time period of 1H for every time period of two fields, as will be described later on in the specification. The present embodiment is designed to compensate for such a signal lack. In the present embodiment, the vertical transfer clock pulse generating circuit 73 has the construction shown in FIG. 13. On the other hand, in a modification of the present embodiment, the vertical transfer clock pulse generating circuit 33-2 shown in FIG. 9 is modified in a manner similar to that of FIG. 13. Since the modification can be readily understood from FIG. 13, the illustration and detailed description of the modification will be omitted.

Figure 13:
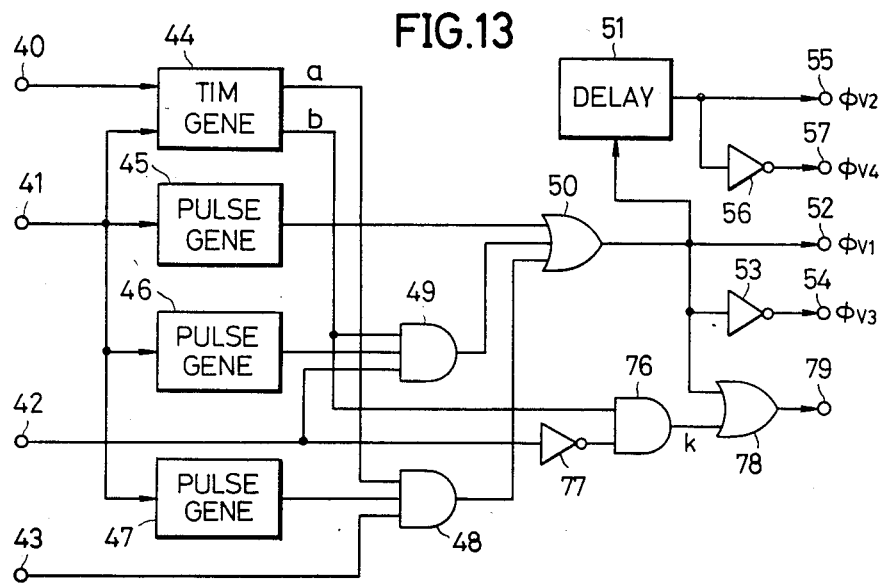
FIG. 13 is a system circuit diagram showing an essential part of the third embodiment shown in FIG. 12.

In FIG. 13, those parts which are the same as those corresponding parts in FIG. 7 are designated by the same reference numerals, and their description will be omitted. It will be assumed that the input composite video signal has a waveform shown in FIG. 14(A) in vicinities of the vertical blanking periods of the odd and even fields. A horizontal synchronizing signal shown in FIG. 14(B) is applied to the input terminal 41 and a vertical synchronizing signal shown in FIG. 14(C) is applied to the input terminal 40. As described before, the timing generating circuit 44 generates the pulses a and b (identical to the pulses a and b shown in FIGS. 8(D) and 8(E)) shown in FIGS. 14(D) and 14(E) based on the horizontal and vertical synchronizing signals supplied thereto. The pulse b is supplied to the AND circuit 49 and to an AND circuit 76. The AND circuit performs a logical multiplication of the pulse b and a signal which is obtained by inverting the drum pulse from the input terminal 42 in an inverter 77. As a result, a pulse k shown in FIG. 14(F) which assumes a high level for a time period of approximately 1H at a rate of once per two fields, is obtained from the AND circuit 76.

The pulse k is supplied to an OR circuit 78 which is also supplied with the output vertical transfer clock pulse $\phi_{V1}$ of the OR circuit 50. The OR circuit 78 obtains a logical sum of the pulses k and $\phi_{V1}$ and supplies an output signal to an output terminal 79. The output signal of the OR circuit 78 obtained from the output terminal 79, is applied to the switching circuit 74 shown in FIG. 12 as a switching signal. The switching circuit 74 is controlled to selectively pass the signal applied to the terminal 74a during a low-level period of the switching signal, and is controlled to selectively pass the input composite video signal applied to the terminal 74b during a high-level period of the switching signal.

A high-level period $b_1$ of the pulse b shown in FIG. 14(E) is a specific time period of 1H within the time period of one field in which the drum pulse assumes a high level. As described before in conjunction with FIGS. 8(E), 8(I) and 8(K), the vertical transfer clock pulses $\phi_{V1}$ through $\phi_{V4}$ are each obtained twice and the vertical transfer is performed twice only during the high-level period $b_1$. As a result, the delay time becomes equal to 262H or 263H. However, during the first of the above two vertical transfers, the signal stored in the input horizontal transfer register 13 is transferred vertically by one stage, and during the second of the two vertical transfers immediately after the first vertical transfer, no stored signal exists in the input horizontal transfer register 13. Thus, the stored content in the input horizontal transfer register 13, which contains no information, is transferred vertically by one stage during the above second vertical transfer. For this reason, a signal lack part 81 indicated in FIG. 14(F) occurs in the output signal of the output horizontal transfer register 17 after a time period of one field.

However, according to the present embodiment, the pulse k assumes a high level during a time period corresponding to the signal lack part 81, and the switch 74 is switched from the terminal 74a to the terminal 74b to selectively pass the signal applied to the terminal 74b. Hence, the input composite video signal shown in FIG. 14(A) is obtained from the switching circuit 74 and is supplied to the lowpass filter 22. Accordingly, a delayed composite video signal shown in FIG. 14(H) having a signal compensated part 82 at a position corresponding to the signal lack part 81 is obtained from the output terminal 34. A similar signal lack is also introduced during the vertical transfer which is performed once for every time period of 1H. However, the switching circuit 74 is switched to the terminal 74b responsive to the output pulse of the OR circuit 78 during the time period in which the vertical transfer clock pulse $\phi_{V1}$ is generated from the OR circuit 50, and the signal lack can be compensated for in a manner similar to that described above. From the practical point of view, the signal lack compensation need not be performed during the vertical transfer which is performed for every time period of 1H because the vertical transfer is performed within the horizontal blanking period, and it is sufficient to perform the signal lack compensation once for every two fields.

In a case where the delay time is not switched for every one field, the lack of the horizontal synchronizing signal and the like once for every two fields will not occur, and only a lack of the pedestal level, for example, occurs during the vertical transfer which is performed within the horizontal blanking period for every time period of 1H. Thus, in a fourth embodiment of the video signal delay circuit according to the present invention shown in FIG. 15, an output voltage of a pedestal level generator 83 is applied to the terminal 74b of the switching circuit 74 instead of the input composite video signal. The output voltage of the pedestal level generator 83 corresponds to the pedestal level and is a constant voltage, and the switching circuit 74 selectively passes the constant voltage during the vertical transfer described before.

In the third and fourth embodiments, it may be readily seen that a delay time of 625H or 525H is obtainable by providing 624 stages in each of the vertical transfer registers 15$_1$ through 15$_m$, omitting the pulse generating circuit 46 and the AND circuit 49 shown in FIG. 7 (or constantly maintaining the gate of the AND circuit 49 in a closed state) and providing a pulse generating circuit for generating 20 pulses within the time period of 1H instead of or in parallel to the pulse generating circuit 47. On the other hand, in a case where 624 stages are provided in each of the vertical transfer registers 15$_1$ through 15$_m$, it is possible to obtain a delay time of 525H by performing the vertical transfer twice during a time period of 100H out of a time period of 525H and performing the vertical transfer once during the remaining time period of 425H.

Figure 16:
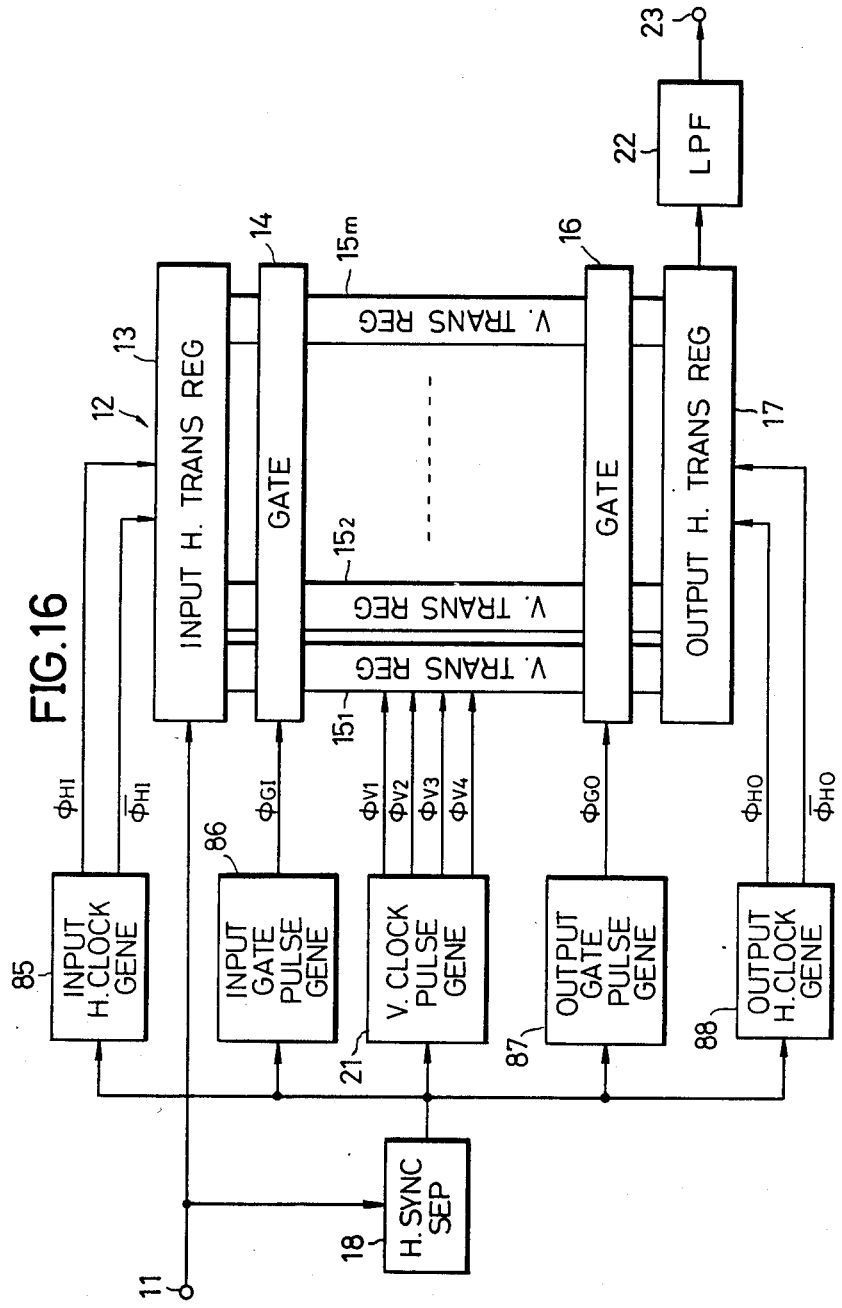
FIG. 16 is a system block diagram showing a fifth embodiment of the video signal delay circuit according to the present invention.
Figure 17:
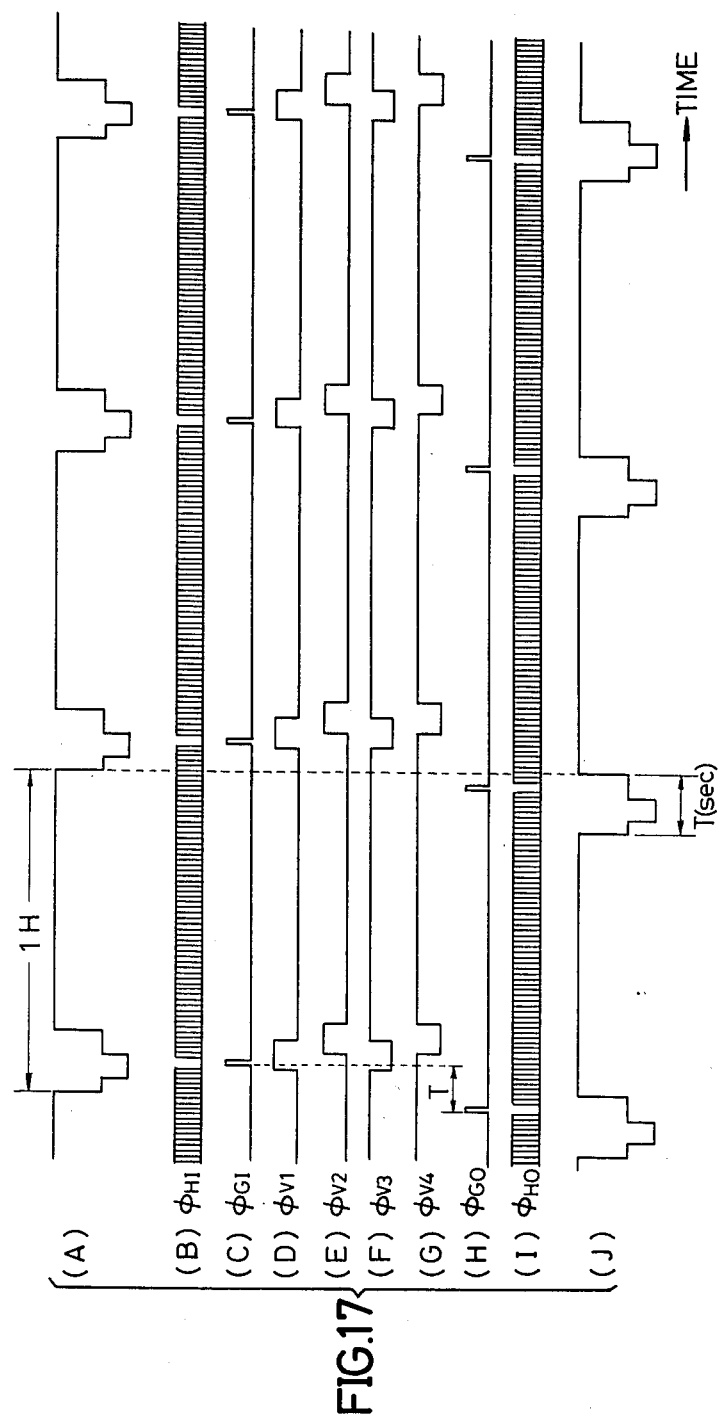
FIGS. 17(A) through 17(J) show signal waveforms for explaining the operation of the fifth embodiment shown in FIG. 16.

Next, a description will be given with respect to a fifth embodiment of the video signal delay circuit according to the present invention, by referring to FIGS. 16 and 17. In FIG. 16, those parts which are the same as those corresponding parts in FIG. 1 are designated by the same reference numerals, and their description will be omitted. In FIG. 16, an input composite video signal shown in FIG. 17(A) is passed through the horizontal synchronizing signal separating circuit 18 and is supplied to an input horizontal transfer clock pulse generating circuit 85, an input vertical transfer gate pulse generating circuit 86, an output vertical transfer gate pulse generating circuit 87, and output horizontal transfer clock pulse generating circuit 88 and the vertical transfer clock pulse generating circuit 21. An input horizontal transfer clock pulse $\phi_{HI}$ as shown in FIG. 17(B) and a pulse $\overline{\phi_{HI}}$ (not shown) having an inverted phase of the input horizontal transfer clock pulse $\phi_{HI}$, are obtained from the input horizontal transfer clock pulse generating circuit 85 and are respectively applied to the input horizontal transfer register 13 as two clock pulses having different phases. The input and output horizontal transfer registers 13 and 17 each comprise m stages, and m input horizontal transfer clock pulses $\phi_{HI}$ are generated within a time period of 1H excluding a specific time period within the horizontal blanking period.

The sampled information which is obtained by sampling the input composite video signal at a frequency equal to the horizontal transfer frequency by the input horizontal transfer clock pulses $\phi_{HI}$ and $\overline{\phi_{HI}}$ and is stored in all of the m stages of the input horizontal transfer register 13, is passed in parallel through the input vertical transfer gate 14 which is opened responsive to the input vertical transfer gate pulse $\phi_{GI}$ from the pulse generating circuit 86, and is supplied to the m columns of vertical transfer registers 15$_1$ through 15$_m$. The input vertical transfer gate pulse $\phi_{GI}$ is generated once for every time period of 1H as shown in FIG. 17(C) and within a time period in which the input horizontal transfer clock pulse $\phi_{HI}$ is not generated as shown in FIG. 17(B). The vertical transfer registers 15$_1$ through 15$_m$ are supplied with the vertical transfer clock pulses $\phi_{V1}$ through $\phi_{V4}$ shown in FIGS. 17(D) through 17(G), as four clock pulses having different phases, once for every time period of 1H and accordingly perform the vertical transfer. The operation described before is essentially the same as the operation of the conventional circuit shown in FIG. 1.

However, in the present embodiment, the phase of an output vertical transfer gate pulse $\phi_{GO}$ which is to be supplied to the output vertical transfer gate 16 from the output vertical transfer gate pulse generating circuit 87 is advanced by T seconds as shown in FIG. 17(H) with respect to the input vertical transfer gate pulse $\phi_{GI}$ shown in FIG. 17(C), where T is less than 1H and is greater than zero. Further, the phase of an output horizontal transfer clock pulse $\phi_{HO}$ from the output horizontal transfer clock pulse generating circuit 88 in advanced by T seconds as shown in FIG. 17(I) with respect to the input horizontal transfer clock pulse $\phi_{HI}$ shown in FIG. 17(B). Accordingly, a composite video signal shown in FIG. 17(J) is obtained from the output horizontal transfer register 16 with a timing which is advanced by T seconds with respect to the conventional timing, and a delay time of (262H−T) is obtained.

According to the present embodiment, a composite video signal which is delayed by a delay time of (262H−T) is supplied to the lowpass filter 22. Thus, when the value of T is selected to a value which is equal to a total delay time of the lowpass filter 22 and the lowpass filter (not shown) for eliminating the aliasing noise coupled to the input stage of the semiconductor delay circuit part 12, the delay times of these lowpass filters are taken into account and a composite video signal which is delayed by a delay time of exactly 262H is obtained from the output terminal 23.

Figure 18:
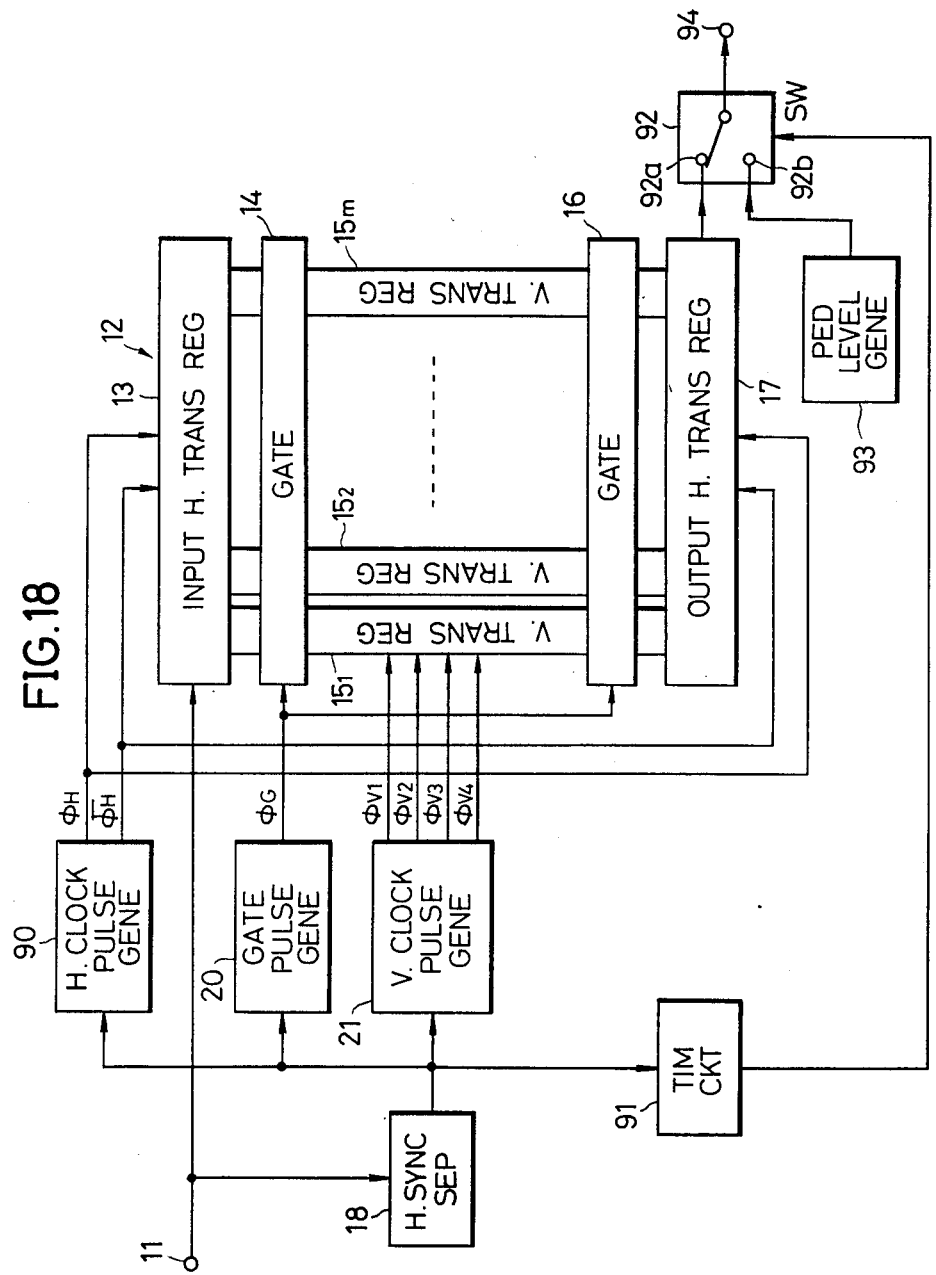
FIG. 18 is a system block diagram showing a sixth embodiment of the video signal delay circuit according to the present invention.
Figure 19:
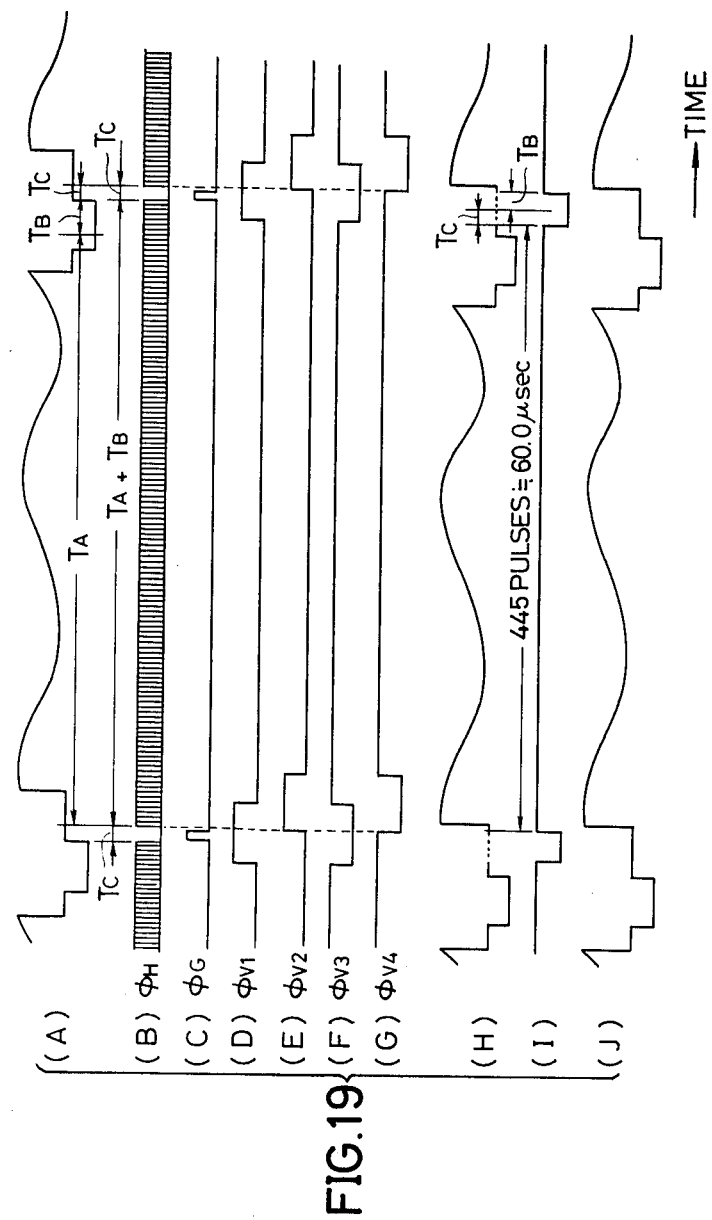
FIGS. 19(A) through 19(J) show signal waveforms for explaining the operation of the sixth embodiment shown in FIG. 18.

Next, a description will be given with respect to a sixth embodiment of the video signal delay circuit according to the present invention, by referring to FIGS. 18 and 19. In FIG. 18, those parts which are the same as those corresponding parts in FIG. 1 are designated by the same reference numerals, and their description will be omitted. In the present embodiment, a number of horizontal transfer clock pulses generated during the time period of 1H is greater than the number of stages m provided in each of the input and output horizontal transfer registers 13 and 17. In FIG. 18, a horizontal synchronizing signal separated from an input composite video signal shown in FIG. 19(A) is supplied to a horizontal transfer clock pulse generating circuit 90. The horizontal transfer clock pulse generating circuit 90 generates a horizontal transfer clock pulse $\phi_H$ shown in FIG. 19(B) and a pulse (not shown) having an inverted phase of the horizontal transfer clock pulse $\phi_H$, and supplies these horizontal transfer clock pulses to the input and output horizontal transfer registers 13 and 17.

A gate pulse $\phi_G$ shown in FIG. 19(C) from the vertical transfer gate pulse generating circuit 20 is supplied to the input and output vertical transfer gates 14 and 16. Vertical transfer clock pulses $\phi_{V1}$ through $\phi_{V4}$ shown in FIGS. 19(D) through 19(G) from the vertical transfer clock pulse generating circuit 21 are supplied to the vertical transfer registers $15_1$ through $15_m$.

It will be assumed that the period of the horizontal transfer clock pulse $\phi_H$ is equal to $1/Nf_H$, where $f_H$ represents the horizontal scanning frequency of the input composite video signal. When it assumed that an effective horizontal transfer period within the time period of 1H by the horizontal transfer clock pulse $\phi_H$ is represented by $T_A$, a phase advance time is represented by $T_B$ and a time period during the vertical transfer in which the horizontal transfer clock pulse is not generated is represented by $T_C$, the following equation (1) stands.

$$T_A + T_B T_C = 1/f_H \quad (1)$$

In addition, the effective horizontal transfer period $T_A$ can be described by the following equation (2) by using the number of stages m in each of the input and output horizontal transfer registers 13 and 17.

$$T_A = m/Nf_H \quad (2)$$

The following equation (3) stands when it is assumed that n pulses are required to make the advance time $T_B$.

$$T_B = n/Nf_H \quad (3)$$

Accordingly, the following equation (4) can be formed from the equations (1) and (2).

$$N = (m/Nf_H)/[(1/f_H) - (T_B + T_C)] \quad (4)$$

In a case where $T_B$ is approximately equal to 2.0 $\mu$sec and $T_C$ is equal to 1.5 $\mu$sec, these values for $T_B$ and $T_C$ can be substituted into the equation (4) together with the value for m which is 445, and N becomes approximately equal to 471 in this case. When N is equal to 471, it can be calculated from the equation (3) that n is equal to 14.82. When it is assumed that n is equal to 15, m+n becomes equal to 460, and it is seen from the relation N−(m+n) that eleven pulses lack during the time period $T_C$ (1.5 $\mu$sec in this case) in which the horizontal transfer clock pulse is not generated. Accordingly, as shown in FIG. 19(B), the effective horizontal transfer period $T_A$ in this case is approximately equal to 60 $\mu$sec, the number of horizontal transfer clock pulses obtained during the period $T_A$ is equal to 445 and the number of horizontal transfer clock pules obtained within the phase advance time $T_B$ (approximately 2.0 $\mu$sec in this case) is equal to 15. On the other hand, eleven horizontal transfer pulses lack in the time period $T_C$ during the vertical transfer in which the horizontal transfer clock pulse is not generated.

As described before, the sampled information obtained by sampling the input composite video signal by the horizontal transfer clock pulses $\phi_H$ and $\overline{\phi_H}$ is temporarily stored in the input horizontal transfer register 13. A stored sampled value is successively shifted to the right in FIG. 18 every time one pulse $\phi_H$ and one pulse $\overline{\phi_H}$ are supplied to the input horizontal transfer register 13. Accordingly, when m pulses $\phi_H$ and m pulses $\overline{\phi_H}$ are supplied to the input horizontal transfer register 13, that is, when 445 pulses $\phi_H$ and 445 pulses $\overline{\phi_H}$ are supplied to the input horizontal transfer register 13, all of the 445 sampled values are all stored in the all of the stages of the input horizontal transfer register 13. However, as described before, 460 pulses $\phi_H$ and 460 pulses $\overline{\phi_H}$ are generated during the time period of $T_A + T_B$ within the time period of 1 H. Hence, 15 more pulses $\phi_H$ and 15 more pulses $\overline{\phi_H}$ are supplied to the input horizontal transfer register 13 after 445 pulses $\phi_H$ and 445 pulses $\overline{\phi_H}$ are supplied to the input horizontal transfer register 13. As a result, among the sampled values stored in the 445 stages of the input horizontal transfer register 13, the first 15 sampled values are discarded (or destroyed), and 15 new sampled values are successively stored in the input horizontal transfer register 13. Therefore, when 460 pulses $\phi_H$ and 460 pulses $\overline{\phi_H}$ are supplied to the input horizontal transfer register 13, 445 sampled values excluding the first 15 sampled values out of the 460 sampled values which are related to the signal information within the time period of 1H of the input composite video signal, are stored in all of the stages of the input horizontal transfer register 13.

The supply of the pulses $\phi_H$ and $\overline{\phi_H}$ to the input horizontal transfer register 13 is interrupted during the time period $T_C$, and the input vertical transfer gate 14 is opened responsive to the vertical transfer gate pulse $\phi_G$. Hence, the 445 sampled values pass through the input vertical transfer gate 14 and are supplied in parallel to the vertical transfer registers $15_1$ through $15_m$. The 445 sampled values which are stored in the first cells of the vertical transfer registers $15_1$ through $15_m$, are successively shifted vertically responsive to the four vertical transfer clock pulses $\phi_{V1}$ through $\phi_{V4}$ which are supplied to the vertical transfer registers $15_1$ through $15_m$ for every time period of 1H. After 262 vertical transfers are performed in the vertical transfer registers $15_1$ through $15_m$, the 445 sampled values pass through the output vertical transfer gate 16 and are supplied in parallel to the output horizontal transfer register 17. The 445 sampled values which are temporarily stored in the output horizontal transfer register 17 are successively shifted to the right in FIG. 18 responsive to the horizontal transfer clock pulses $\phi_H$ and $\overline{\phi_H}$. The 445 sampled values are obtained serially from the output horizontal transfer register 17 and are applied to a terminal 92a of a switching circuit 92. Among the 445 sampled values stored in the output horizontal transfer register 17, the first sampled value which is obtained from the output horizontal transfer register 17 is the sixteenth sampled value after the time period $T_B$ out of the 460 sampled value related to the signal information within the time period of 1H of the input composite video signal. The sampled values are thereafter obtained serially from the output horizontal transfer register 17 in a sequence of the seventeenth sampled value, eighteenth sampled value, . . . , and 460-th sampled value. Therefore, a composite video signal shown in FIG. 19(H) (sequence of sampled values) which is delayed by a delay time of (262H-$T_B$) is obtained at the output of the output horizontal transfer register 17.

As may be understood from the description of the present embodiment given heretofore, among the 460 sampled values related to the signal information within the time period of 1H of the input composite video signal, the first 15 sampled values within the time period $T_C$ during the vertical transfer and within the time period $T_B$ immediately after the time period $T_C$ are missing from the output signal of the output horizontal transfer register 17, as may be seen from FIG. 19(H). Hence, a description will hereinafter be given with respect to the compensation of this signal lack. In FIG. 18, a constant voltage corresponding to the pedestal level is applied to a terminal 92b of the switching circuit 92 from a pedestal level generator 93. On the other hand, a timing generating circuit 91 generates a pulse shown in FIG. 19(I) which assumes a high level only during a time period corresponding to the time period $T_C + T_B$ in which there is signal lack. In the present case, the time period $T_C + T_B$ is equal to 3.5μsec and corresponds to 26 pulses $\phi_H$ or $\overline{\phi_H}$. The output pulse of the timing generating circuit 91 is applied to the switching circuit 92 as a switching pulse, and the switching circuit 92 is controlled to pass the signal applied to the terminal 92a during a low-level period of the switching pulse and is controlled to pass the signal applied to the terminal 92b during a high-level period of the switching pulse.

Accordingly, the switching circuit 92 normally passes and supplies the output delayed composite video signal of the output horizontal transfer register 17 to an output terminal 94. During a signal lack period in which the pulse shown in FIG. 19(I) assumes a high level, the switching circuit 92 selectively passes and supplies the output constant voltage of the pedestal level generator 93 to the output terminal 94. Thus, a composite video signal shown in FIG. 19(J) which is compensated to the signal lack and is delayed by a delay time of (262H−$T_B$), is obtained from the output terminal 94.

In the fifth embodiment shown in FIG. 16, the phases of the input horizontal transfer clock pulses $\phi_{HI}$ and $\overline{\phi_{HI}}$ with respect to the phases of the output horizontal transfer clock pulses $\phi_{HO}$ and $\overline{\phi_{HO}}$ and the phase of the input vertical transfer gate pulse $\phi_{GI}$ with respect to the phase of the output vertical transfer gate pulse $\phi_{GO}$, may be respectively retarded by T. In this case, it is possible to obtain a delay time of (262H+T). When the phase retardation T is selected to a large value which is close to 1H, it is possible to obtain a desired delay time essentially inclusive of the delays in the lowpass filters. In addition, the time period in which there is signal lack is slightly larger in the sixth embodiment, however, the vertical transfer gate pulses $\phi_{GI}$ and $\phi_{GO}$ need not have a relative phase difference and it is sufficient to advance or retard the phases of the output horizontal transfer clock pulses $\phi_{HO}$ and $\overline{\phi_{HO}}$ with respect to the phases of the input horizontal transfer clock pulses $\phi_{HI}$ and $\overline{\phi_{HI}}$.

Further, a switching circuit may be provided in the input or output stage of the lowpass filter 22 in FIG. 16. In this case, the switching circuit is normally controlled to selectively pass the output signal of the output horizontal transfer register 17, and is controlled to selectively pass a constant voltage (such as a voltage corresponding to the pedestal level) or the input composite video signal only during the vertical transfer period. In this case, it is possible to compensate for the signal lack during the vertical transfer.

Moreover, it is not essential to provide signal lack compensation means such as the switching circuit 92 and the like in FIG. 18. The original object which is to obtain a desired delay time, may be achieved in this case although the picture quality of the reproduced picture will become slightly deteriorated. In addition, in a case where the time period $T_B$ is small, the system shown in FIG. 18 may be designed to selectively produce the input composite video signal during the time period in which there is signal lack, not the output voltage of the pedestal level generator 93.

Figure 20:
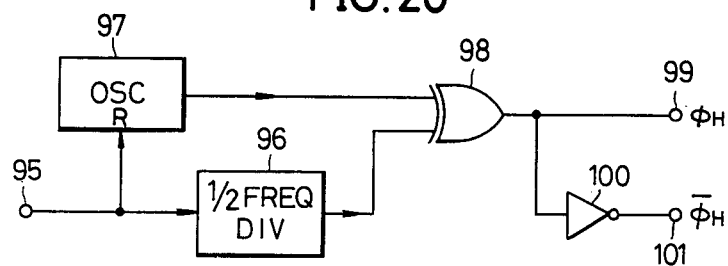
FIG. 20 is a system circuit diagram showing a first embodiment of a horizontal transfer clock pulse generating circuit within the video signal delay circuit according to the present invention.

Next, descriptions will be given with respect to embodiments of the horizontal transfer clock pulse generating circuit 19 which enables simplification of the circuit construction of the lowpass filter 22. FIG. 20 is a system circuit diagram showing a first embodiment of the horizontal transfer clock pulse generating circuit 19. In FIG. 20, a horizontal synchronizing signal of the input composite video signal which is to be delayed, is applied to an input terminal 95. The horizontal synchronizing signal is frequency-divided by ½ in a ½-frequency divider 96, and is also supplied to an oscillator 97 as a reset pulse. When it is assumed that the horizontal synchronizing signal has a waveform shown in FIG. 21(A), an output signal of the frequency divider 96 becomes a symmetrical square wave shown in FIG. 21(B) which is inverted responsive to every rising edge of the horizontal synchronizing signal and has a period of 2H.

On the other hand, the oscillator 97 produces a pulse having a repetition frequency identical to that of the horizontal transfer clock pulse. The oscillator 97 is forcibly reset responsive to the rising edge of the horizontal synchronizing signal applied to a reset terminal R thereof. When the oscillator 97 is reset, the output signal level thereof is forcibly changed to a low level. The oscillator 97 again starts to produce a series of pulses having a constant period after the oscillator 97 is reset. Accordingly, the output signal of the oscillator 97 is a series of pulses shown in FIG. 21(C) which constantly assumes a low level responsive to the rising edge of the horizontal synchronizing signal and is in phase synchronizing with the horizontal synchronizing signal. The series of pulses from the oscillator 97 is supplied to one input terminal of a 2-input exclusive-OR circuit 98. The output signal of the frequency divider 96 is supplied to the other input terminal of the exclusive-OR circuit 98. Hence, a series of pulses shown in FIG. 21(D) is obtained from the exclusive-OR circuit 98.

Figure 21:
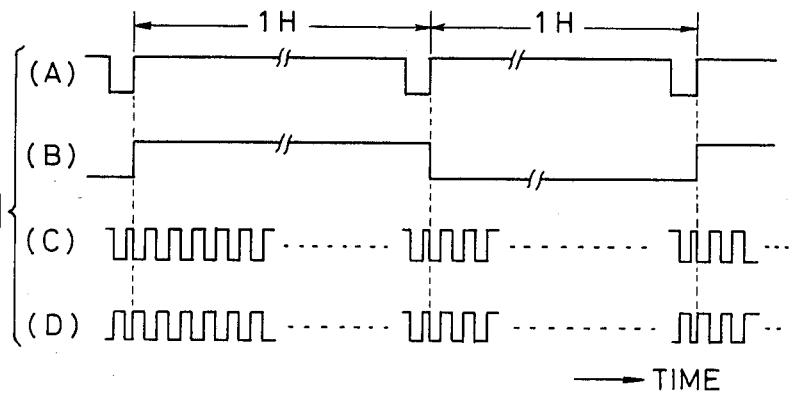
FIGS. 21(A) through 21(D) show signal waveforms for explaining the operation of the circuit system shown in FIG. 20.

As may be seen from FIG. 21(D), the series of pulses from the exclusive-OR circuit 98 has such a waveform that the phase thereof is inverted for every time period of 1H. The series of pulses from the exclusive-OR circuit 98 is obtained from an output terminal 99 as the horizontal transfer clock pulse $\phi_H$. The series of pulses from the exclusive-OR circuit 98 is also passed through an inverter 100, and an output signal of the inverter 100 is obtained from an output terminal 101 as the horizontal transfer clock pulse $\overline{\phi_H}$. The phase of each of the horizontal transfer clock pulses $\phi_H$ and $\overline{\phi_H}$ is inverted for every time period of 1H, and the horizontal transfer clock pulses $\phi_H$ and $\overline{\phi_H}$ are in a frequency interleaved relationship to the horizontal scanning frequency $f_H$ of the input composite video signal. Therefore, even when the horizontal transfer clock pulses $\phi_H$ and $\overline{\phi_H}$ leak into the delayed composite video signal as crosstalk, the crosstalk frequency component is essentially visually inconspicuous in the reproduced picture. Hence, an inexpensive lowpass filter which has a wider band and has a more gradual cutoff frequency characteristic compared to the lowpass filter used in the conventional circuit, may be used for the lowpass filter 22.

Figure 22:
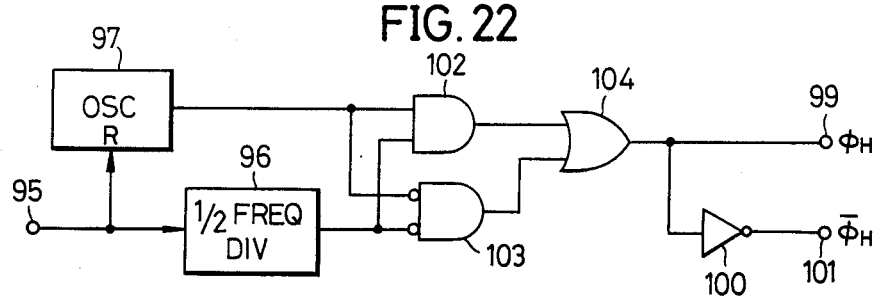
FIG. 22 is a system circuit diagram showing a second embodiment of the horizontal transfer clock pulse generating circuit within the video signal delay circuit according to the present invention.

Next, a description will be given with respect to a second embodiment of the horizontal transfer clock pulse generating circuit 19, by referring to FIG. 22. In FIG. 22, those parts which are the same as those corresponding parts in FIG. 20 are designated by the same reference numerals, and their description will be omitted. In FIG. 22, the series of pulses from the oscillator 97 is supplied to one input terminal of a 2-input AND circuit 102 and to one input terminal of a 2-input NAND circuit 103. The output pulse of the frequency divider 96 is supplied to the other input terminal of the AND circuit 102 and to the other input terminal to the NAND circuit 103. Accordingly, during a time period of 1H in which the output pulse of the frequency divider 96 assumes a high level, an output signal of the AND circuit 102 becomes the same as the series of pulses from the oscillator 97, and an output signal of the NAND circuit 103 constantly assumes a low level. On the other hand, during a time period of 1H in which the output pulse of the frequency divider 96 assumes a low level, the output signal of the AND circuit 102 constantly assumes a low level, and the output signal of the NAND circuit 103 becomes the same as the series of pulses from the oscillator 97.

The output signals of the AND circuit 102 and the NAND circuit 103 are supplied to an OR circuit 104. Hence, a pulse shown in FIG. 21(D) which has the same repetition frequency as the series of pulses from the oscillator 97 and in which the phase is inverted for every time period of 1H, is obtained from the OR circuit 104. The output pulse of the OR circuit 104 is supplied to the output terminal 99 as the horizontal transfer clock pulse $\phi_H$. Moreover, the output pulse of the OR circuit 104 is passed through the inverter 100, and the output pulse of the inverter 100 is supplied to the output terminal 101 as the horizontal transfer clock pulse $\overline{\phi_H}$.

The oscillator 97 may be designed to produce a signal having a frequency related to the frequency of the horizontal transfer clock pulse. In this case, the desired frequency of the horizontal transfer clock pulse may be obtained by passing the output signal of the oscillator 97 through frequency dividing means or frequency multiplying means.

Further, the present invention is not limited to these embodiments, but various variations and modifications may be made without departing from the scope of the present invention.

What is claimed is:

1. A video signal delay circuit comprising:

an input horizontal transfer register serially supplied with an input composite video signal for transferring horizontally every time an input horizontal transfer clock pulse is applied thereto sampled signals obtained by sampling the input composite video signal by the input horizontal transfer clock pulse;

an input vertical transfer gate supplied in parallel with the sampled signals from said input horizontal transfer register, for passing the sampled signals during a time period in which said input horizontal transfer register does not perform a horizontal transfer;

a plurality of columns of vertical transfer registers supplied with the sampled signals from said input vertical transfer gate, each of said columns of vertical transfer registers having a constant number of stages and successively transferring vertically one of said sampled signals supplied thereto every time a vertical transfer clock pulse is applied thereto;

an output vertical transfer gate for gating parallel output signals of said columns of vertical transfer registers;

an output horizontal transfer register for temporarily storing said parallel output signals of said output vertical transfer gate and for transferring horizontally the stored signals every time an output horizontal transfer clock pulse is applied thereto so as to serially produce a delayed composite video signal;

a horizontal transfer clock pulse generating circuit for generating the input and output horizontal transfer clock pulses based on a horizontal synchronizing signal within the input composite video signal and for supplying the input and output horizontal transfer clock pulses to said input and output horizontal transfer registers;

a vertical transfer clock pulse generating circuit for generating the vertical transfer clock pulse based on horizontal and vertical synchronizing signals within the input composite video signal, said output horizontal transfer register producing a composite video signal delayed by M horizontal scanning periods when said vertical transfer clock pulse generating circuit supplies the vertical transfer clock pulse to said vertical transfer registers at a rate of once per one horizontal scanning period of the input composite video signal, where M is a natural number greater than one, said output horizontal transfer register producing a composite video signal delayed by N horizontal scanning periods when said vertical transfer clock pulse generating circuit supplies the vertical transfer clock pulse to said vertical transfer registers at a rate of once per one horizontal scanning period of the input composite video signal and one or more times at specific positions within said N horizontal scanning periods, where N is a natural number less than M; and a vertical transfer gate pulse generating circuit for generating input and output vertical transfer gate pulses which are in phase synchronism with the output vertical transfer clock pulse of said vertical transfer clock pulse generating circuit based on the horizontal and vertical synchronizing signals within the input composite video signal and for supplying the input vertical transfer gate pulse to said input vertical transfer gate and the output vertical transfer gate pulse to said output vertical transfer gate.

2. A video signal delay circuit as claimed in claim 1 in which said vertical transfer clock pulse generating circuit further generates the vertical transfer clock pulse (M−N) times within a vertical blanking period of the input composite video signal when a delay time of said N horizontal scanning periods is to be obtained by said video signal delay circuit.

3. A video signal delay circuit as claimed in claim 1 in which M is equal to a number of horizontal scanning lines included within one field of the input composite video signal plus one half the horizontal scanning period, N is equal to a number of horizontal scanning lines included within one field of the input composite video signal minus one half the horizontal scanning period, and said vertical transfer clock pulse generating circuit generates the vertical transfer clock pulse so that a delay time of said video signal delay circuit is alternately switched between a delay time of said M horizontal scanning periods and a delay time of said N horizontal scanning periods.

4. A video signal delay circuit as claimed in claim 2 in which N is equal to a first value $N_1$ or a second value $N_2$, said first value $N_1$ being equal to one field of the input composite video signal plus one half the horizontal scanning period, said second value $N_2$ being equal to one field of the input composite video signal minus one half the horizontal scanning period, and said vertical transfer clock pulse generating circuit generates the vertical transfer clock pulse so that the delay time of said video signal delay circuit is alternately switched between a delay time of $N_1$ horizontal scanning periods and a delay time of $N_2$ horizontal scanning periods for every time period of one field.

5. A video signal delay circuit as claimed in claim 1 in which said vertical transfer clock pulse generating circuit generates the vertical transfer clock pulse at a rate of once per one horizontal scanning period of the input composite video signal during (2N−M) horizontal scanning periods out of the N horizontal scanning periods of the input composite video signal and generates the vertical transfer clock pulse at a rate of twice per one horizontal scanning period during the remaining (M−N) horizontal scanning periods when a delay time of said N horizontal scanning periods is to be obtained by said video signal delay circuit, where N is a natural number less than M and greater than M/2.

6. A video signal delay circuit as claimed in claim 5 in which M is equal to a number of horizontal scanning lines included within one field of the input composite video signal plus one half the horizontal scanning period, N is equal to a number of horizontal scanning lines included within one field of the input composite video signal minus one half the horizontal scanning period, and said vertical transfer clock pulse generating circuit generates the vertical transfer clock pulse so that a delay time of said video signal delay circuit is alternately switched between a delay time of said M horizontal scanning periods and a delay time of said N horizontal scanning periods for every time period of one field.

7. A video signal delay circuit as claimed in claim 5 in which N is equal to a first value $N_1$ or a second value $N_2$, said first value $N_1$ being equal to a number of horizontal scanning lines included within one field of the input composite video signal plus one half the horizontal scanning period, said second value $N_2$ being equal to a number of horizontal scanning lines included within one field of the input composite video signal minus one half the horizontal scanning period, and said vertical transfer clock pulse generating circuit generates the vertical transfer clock pulse so that the delay time of said video signal delay circuit is alternately switched between a delay time of $N_1$ horizontal scanning periods and a delay time of $N_2$ horizontal scanning periods for every time period of one field.

8. A video signal delay circuit as claimed in claim 1 which further comprises switching circuit means having a first terminal applied with the output signal of said output horizontal transfer register and a second terminal applied with a constant voltage or the input composite video signal, said switching circuit means normally selectively passing the output signal of said output horizontal transfer register, said switching circuit means selectively passing the constant voltage or the input composite video signal at least during a time period in which a vertical transfer is performed.

9. A video signal delay circuit as claimed in claim 8 in which said switching circuit means selectively passes the constant voltage or the input composite video signal during a time period in which there is a signal lack in the output delayed composite video signal of said output horizontal transfer register which signal lack occurs at a rate of once per time period of two fields when a delayed composite video signal having a delay time thereof alternately switched for every time period of one field is obtained from said output horizontal transfer register.

10. A video signal delay circuit as claimed in claim 1 in which said horizontal transfer clock pulse generating circuit comprises oscillator means for producing pulses having a repetition frequency related to the frequency of the horizontal transfer clock pulses, said oscillator means being forcibly reset by the horizontal synchronizing signal within the input composite video signal, and gate circuit means supplied with the output pulses of said oscillator means and the horizontal synchronizing signal within the input composite video signal for producing pulses having a repetition frequency identical to that of the horizontal transfer clock pulses and having a phase which is inverted for every one horizontal scanning period of the input composite video signal, the output pulses of said gate circuit means being produced as the horizontal transfer clock pulses.

11. A video signal delay circuit comprising:
an input horizontal transfer register serially supplied with an input composite video signal for transferring horizontally every time an input horizontal transfer clock pulse is applied thereto sampled signals obtained by sampling the input composite video signal by the input horizontal transfer clock pulse;
an input vertical transfer gate supplied in parallel with the sampled signals from said input horizontal transfer register, for passing the sampled signals during a time period in which said input horizontal transfer register does not perform a horizontal transfer;
a plurality of columns of vertical transfer registers supplied with the sampled signals from said input vertical transfer gate, each of said columns of vertical transfer registers having a constant number of stages and successively transferring vertically one of said sampled signals supplied thereto every time a vertical transfer clock pulse is applied thereto;

an output vertical transfer gate for gating parallel output signals of said columns of vertical transfer registers;

an output horizontal transfer register for temporarily storing said parallel output signals of said output vertical transfer gate and for transferring horizontally the stored signals every time an output horizontal transfer clock pulse is applied thereto so as to serially produce a delayed composite video signal;

input and output horizontal transfer clock pulse generating circuits for generating the input and output horizontal transfer clock pulses based on a horizontal synchronizing signal within the input composite video signal and for supplying the input and output horizontal transfer clock pulses to said input and output horizontal transfer registers;

a vertical transfer clock pulse generating circuit for generating the vertical transfer clock pulse based on the horizontal synchronizing signal within the input composite video signal, said output horizontal transfer register producing a composite video signal delayed by M horizontal scanning periods when said vertical transfer clock pulse generating circuit supplies the vertical transfer clock pulse to said vertical transfer registers at a rate of once per one horizontal scanning period of the input composite video signal, where M is a natural number greater than one; and input and output vertical transfer gate pulse generating circuits for generating input and output vertical transfer gate pulses based on the horizontal synchronizing signal within the input composite video signal and for supplying the input vertical transfer gate pulse to said input vertical transfer gate and the output vertical transfer gate pulse to said output vertical transfer gate, said output horizontal transfer clock pulse generating circuit generating the output horizontal transfer clock pulse with a phase which is advanced or retarded by a time period t with respect to the input horizontal transfer clock pulse, where t is smaller than one horizontal scanning period.

12. A video signal delay circuit as claimed in claim 11 in which said output vertical transfer gate pulse generating circuit generates the output vertical transfer gate pulse with a phase which is advanced or retarded with respect to the input vertical transfer gate pulse.

13. A video signal delay circuit as claimed in claim 11 which further comprises switching circuit means having a first terminal applied with the output signal of said output horizontal transfer register and a second terminal applied with a constant voltage or the input composite video signal, said switching circuit means normally selectively passing the output signal of said output horizontal transfer register, said switching circuit means selectively passing the constant voltage or the input composite video signal at least during a time period in which a vertical transfer is performed.

14. A video signal delay circuit comprising:

an input horizontal transfer register, having a constant number of stages, serially supplied with an input composite video signal for transferring horizontally every time an input horizontal transfer clock pulse is applied thereto sampled signals obtained by sampling the input composite video signal by the input horizontal transfer clock pulse;

an input vertical transfer gate supplied in parallel with the sampled signals from said input horizontal transfer register, for passing the sampled signals during a time period in which said input horizontal transfer register does not perform a horizontal transfer;

a plurality of columns of vertical transfer registers supplied with the sampled signals from said input vertical transfer gate, each of said columns of vertical transfer registers having a constant number of stages and successively transferring vertically one of said sampled signals supplied thereto every time a vertical transfer clock pulse is applied thereto;

an output vertical transfer gate for gating parallel output signals of said columns of vertical transfer registers;

an output horizontal transfer register, having a constant number of stages, for temporarily storing said parallel output signals of said output vertical transfer gate and for transferring horizontally the stored signals every time an output horizontal transfer clock pulse is applied thereto so as to serially produce a delayed composite video signal;

a horizontal transfer clock pulse generating circuit for generating a number of clock pulses greater than the number of stages in each of said input and output horizontal transfer registers during a time period in which a vertical transfer is not performed in said vertical transfer registers based on a horizontal synchronizing signal within the input composite video signal and for supplying the clock pulses as the input and output horizontal transfer clock pulses to said input and output horizontal transfer registers;

a vertical transfer clock pulse generating circuit for generating the vertical transfer clock pulse based on the horizontal synchronizing signal within the input composite video signal, said output horizontal transfer register producing a composite video signal delayed by M horizontal scanning periods when said vertical transfer clock pulse generating circuit supplies the vertical transfer clock pulse to said vertical transfer registers at a rate of once per one horizontal scanning period of the input composite video signal, where M is a natural number greater than one; and a vertical transfer gate pulse generating circuit for generating input and output vertical transfer gate pulses based on the horizontal synchronizing signal within the input composite video signal and for supplying the input vertical transfer gate pulse to said input vertical transfer gate and the output vertical transfer gate pulse to said output vertical transfer gate.

15. A video signal delay circuit as claimed in claim 14 which further comprises switching circuit means having a first terminal applied with the output signal of said output horizontal transfer register and a second terminal applied with a constant voltage or the input composite video signal, said switching circuit means normally selectively passing the output signal of said output horizontal transfer register, said switching circuit means selectively passing the constant voltage or the input composite video signal during a time period in which a vertical transfer is performed and during a time period in which a number of said horizontal transfer clock pulses greater than the number of stages in each of said input and output horizontal transfer registers are generated.

16. A video signal delay circuit as claimed in claim 14 in which said horizontal transfer clock pulse generating circuit comprises oscillator means for producing pulses having a repetition frequency related to the frequency of the horizontal transfer clock pulses, said oscillator means being forcibly reset by the horizontal synchronizing signal within the input composite video signal, and gate circuit means supplied with the output pulses of said oscillator means and the horizontal synchronizing signal within the input composite video signal for producing pulses having a repetition frequency identical to that of the horizontal transfer clock pulses and having a phase which is inverted for every one horizontal scanning period of the input composite video signal, the output pulses of said gate circuit means being produced as the horizontal transfer clock pulses.

* * * * *